United States Patent
Terashi et al.

Patent Number: 5,916,834
Date of Patent: Jun. 29, 1999

[54] DIELECTRIC CERAMICS

[75] Inventors: Yoshitake Terashi; Nobuya Kawai, both of Kokubu, Japan

[73] Assignee: Kyocera Corporation, Kyoto, Japan

[21] Appl. No.: 08/999,484

[22] Filed: Dec. 29, 1997

[30] Foreign Application Priority Data

| Dec. 27, 1996 | [JP] | Japan | 8-350071 |
| Dec. 27, 1996 | [JP] | Japan | 8-350072 |
| Feb. 28, 1997 | [JP] | Japan | 9-045571 |
| May 26, 1997 | [JP] | Japan | 9-134871 |

[51] Int. Cl.$^6$ ............ C04B 35/46; C04B 35/00
[52] U.S. Cl. ............ 501/135; 501/134; 501/136
[58] Field of Search ............ 501/134, 135, 501/136

[56] References Cited

U.S. PATENT DOCUMENTS 5,767,030  6/1998  Kim et al. .............. 501/136

OTHER PUBLICATIONS

Chemical Abstract No. 129:48230, abstract of an article by Kim et al entitled "Microwave Properties of Magnesium Modified Zinc Titanate", J. Korean Phys. Soc. 32, 1998.
WPIDS Abstract No. 93-121627, abstract of Japanese Patent Specification No. 05-059359, Mar. 1993.
WPIDS Abstract No. 98-291934, abstract of Japanese Patent Specification No. 10-101415, Apr. 1998.
WPIDS Abstract No. 98-291935, abstract of Japanese Patent Specification No. 10-101416, Apr. 1998.

*Primary Examiner*—Anthony Green
*Attorney, Agent, or Firm*—Loeb & Loeb LLP

[57] ABSTRACT

Dielectric ceramics comprising 85 to 99.95% by weight of a Zn-containing composite oxide of which the composition of constituent metals is represented by the following formula (1) as expressed by atomic ratios:

$$a(Zn_{1-x} \cdot Mg_x) \cdot b(Ti_{1-y} \cdot Si_y) \qquad (1)$$

wherein x, y, a and b are numbers satisfying the following conditions,
$0 \leq x \leq 0.75$
$0 \leq y \leq 1$
$0.14 \leq a/b \leq 3.5$ where $a/b \neq 1$ when $x=y=0$, and 0.05 to 15% by weight of $B_2O_3$, and exhibiting a dielectric loss tangent at 30 to 60 GHz of not larger than $30 \times 10^{-4}$. The dielectric ceramics have a small dielectric loss tangent in a high-frequency region, can be obtained upon being fired together with low-resistance metals such as copper or silver, and can be very effectively utilized as the wiring boards of various electronic equipment adapted for use at high frequencies.

14 Claims, 14 Drawing Sheets

FIG. I
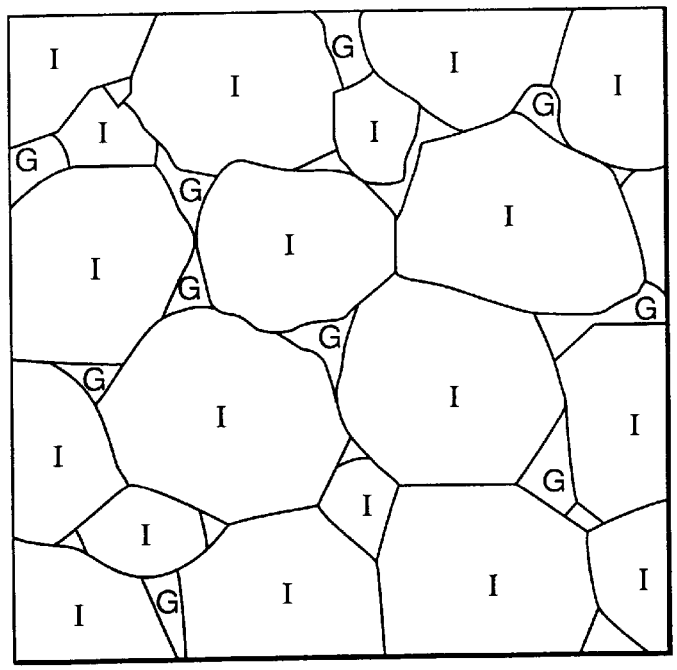
FIG. 2
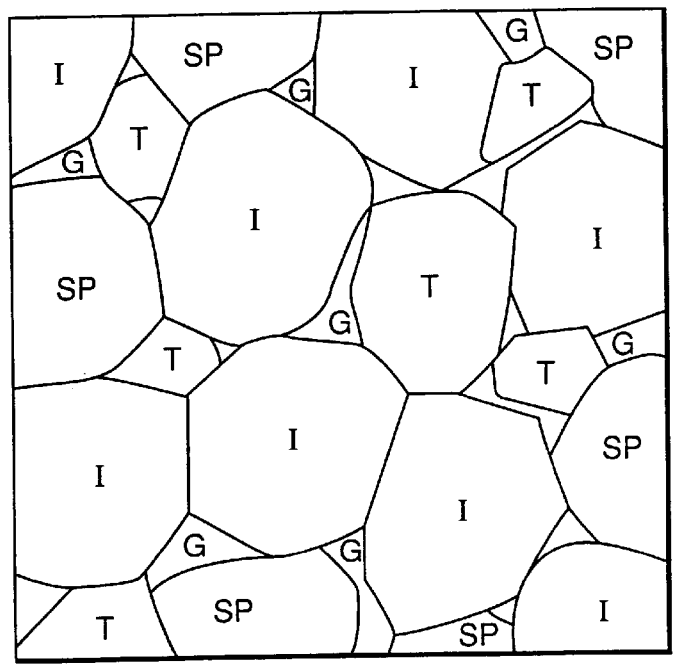

F I G. 3
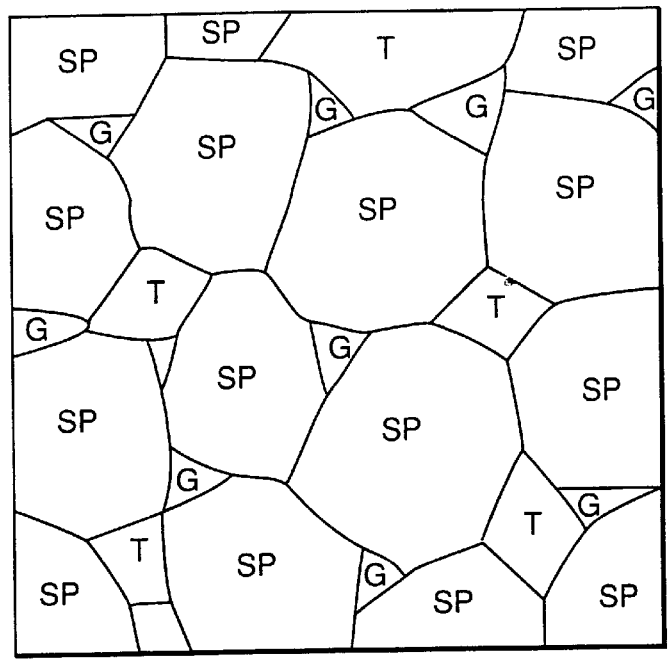
F I G. 4
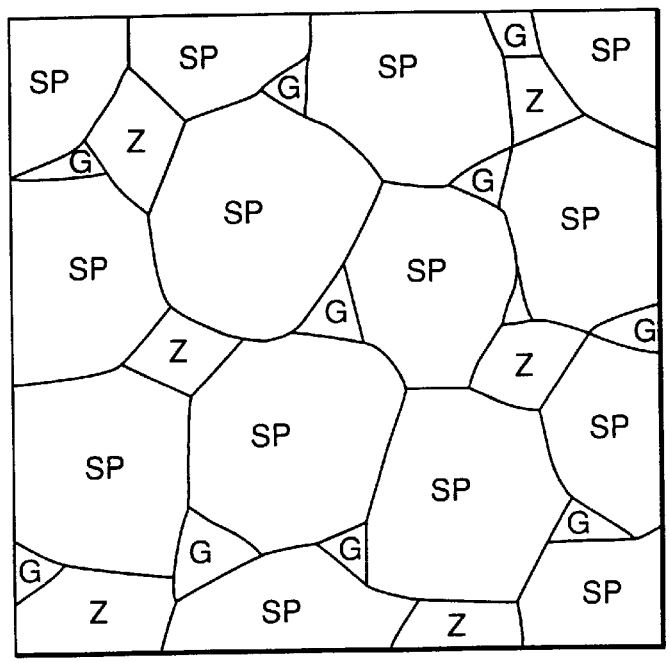

DIELECTRIC CERAMICS

BACKGROUND OF THE INVENTION

1. Field of the Invention

The present invention relates to dielectric ceramics, and particularly to dielectric ceramics that can be fired together with copper or silver and that can be used for electric parts (e.g., wiring board, dielectric resonator, LC filter, capacitor, dielectric waveguide, dielectric antenna, etc.) adapted for use at high frequencies such as micro waves and millimeter waves.

2. Description of the Prior Art

In the age of highly sophisticated information in recent years, it is a tendency to transmit information at higher speeds at higher frequencies. In the new media such as mobile wireless systems like automotive telephones and personal wireless systems, or satellite broadcast systems, satellite communication systems, CATV, etc., attempts have been made to use higher frequencies accompanied by a strong demand for applying higher frequencies even for the existing circuit elements for microwave use such as dielectric resonators.

In the circuit elements for microwave use, it is necessary to lower dielectric loss tangent. For this purpose, it is desired to use a dielectric having a small dielectric loss tangent and to use a low-resistance metal such as copper or silver as a conductor for forming circuits.

In order to meet the above-mentioned demand for decreasing the dielectric loss tangent, Japanese Laid-Open Patent Publication No. 225825/1993 discloses a circuit board made of a dielectric ceramic composition containing a composite perovskite-type compound.

However, the circuit board of the above-mentioned prior art is produced through firing at a temperature as high as from 1300 to 1600° C. leaving a problem in that it is not allowed to form a conductor circuit through the simultaneous firing with a low-resistance metal such as copper or silver. Furthermore, a circuit board has heretofore been known by using an insulating board made of alumina. In this case, too, the firing must be conducted at a high temperature making it difficult to form a conductor circuit by the simultaneous firing with copper or silver. Namely, these circuit boards have a fatal defect in that it is not allowed to form a multiplicity of layers by using a low-resistance metal such as copper or silver or it is not allowed to fabricate fine wirings.

It can be further contrived to use a glass ceramic to avoid the above-mentioned problems. The glass ceramic material can be fired at a temperature of not higher than 1000° C. and can, hence, be fired together with a low-resistance metal such as copper or silver, making it possible to realize a multi-layer structure. However, most of the conventional glass ceramic materials have dielectric loss tangent which is as large as $30 \times 10^{-4}$ in a microwave region of 10 GHz, and are not capable of decreasing the dielectric loss tangent as demanded by the devices used at high frequencies. Moreover, these glass ceramic materials must contain a glass component in an amount of at least not smaller than 30% by weight, so that they can be fired at a temperature of not higher than 1000° C. As a result, properties of the obtained ceramics vary to a large extent depending upon the properties of the glass, suppressing excellent properties of the filler components used in combination with the glass component.

SUMMARY OF THE INVENTION

It is therefore an object of the present invention to provide dielectric ceramics that can be fired at 800 to 1000° C. and exhibits a low dielectric loss tangent in a high-frequency region of not lower than 30 GHz.

According to the present invention, there is provided dielectric ceramics comprising 85 to 99.95% by weight of a Zn-containing composite oxide of which the composition of constituent metals is represented by the following formula (1) as expressed by atomic ratios:

$$a(Zn_{1-x} \cdot Mg_x) \cdot b(Ti_{1-y} \cdot Si_y) \quad (1)$$

wherein x, y, a and b are numbers satisfying the following conditions, $0 \leq x \leq 0.75$
$0 \leq y \leq 1$
$0.14 \leq a/b \leq 3.5$ where $a/b \neq 1$ when $x=y=0$, and 0.05 to 15% by weight of $B_2O_3$, and exhibiting a dielectric loss tangent at 30 to 60 GHz of not larger than $30 \times 10^{-4}$.

According to the present invention, furthermore, there is provided dielectric ceramics comprising 70 to 99.9% by weight of a Zn-containing composite oxide having a composition expressed by the above-mentioned formula (1) and 0.1 to 30% by weight of a glass containing at least $SiO_2$ and $B_2O_3$, and exhibiting a dielectric loss tangent at 30 to 60 GHz of not larger than $30 \times 10^{-4}$.

BRIEF DESCRIPTION OF THE DRAWINGS

FIGS. 1 and 2 are diagrams illustrating a structure of ZnMgTi-type ceramics according to the present invention;

FIGS. 3 and 4 are diagrams illustrating a structure of ZnTi-type ceramics according to the present invention;

DETAILED DESCRIPTION OF THE INVENTION

Figure 5:
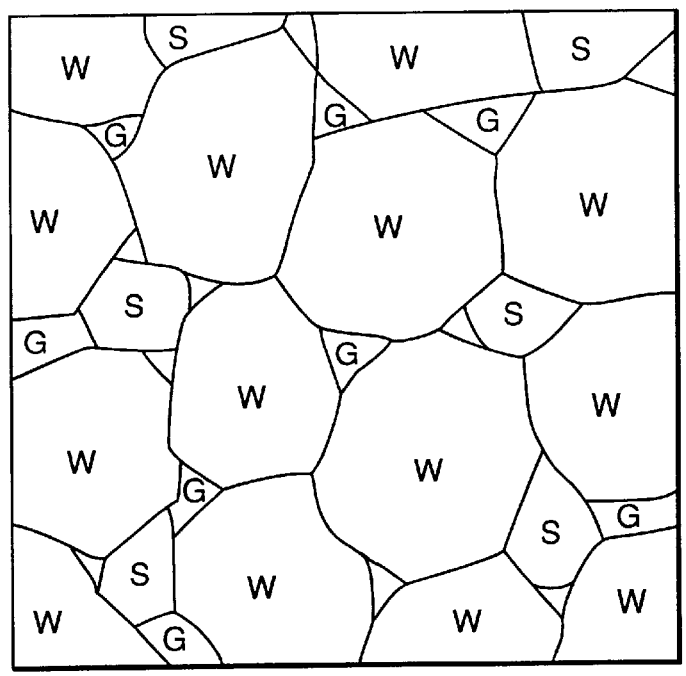
FIG. 5 is a diagram illustrating a structure of ZnSi-type ceramics according to the present invention.

The dielectric ceramics of the present invention comprises a Zn-containing composite oxide having a composition as expressed by the above-mentioned formula (1) and $B_2O_3$ at a predetermined ratio. Owing to this composition, the dielectric ceramics of the invention exhibits a small dielectric loss tangent in a high-frequency region. Concretely speaking, the dielectric ceramics of the invention exhibits a dielectric loss tangent at 30 to 60 GHz of not larger than $30 \times 10^{-4}$. Depending upon the composition of the Zn-containing composite oxide, furthermore, the dielectric ceramics of the invention exhibits a dielectric loss tangent of not larger than $20 \times 10^{-4}$ or not larger than $15 \times 10^{-4}$ in the same frequency region.

If briefly described, the dielectric ceramics of the present invention is obtained by mixing an oxide or an oxide source containing Zn, Mg, Ti and Si at a ratio that satisfies the composition of the above-mentioned formula (1) and $B_2O_3$ working as a sintering assistant at a predetermined ratio, followed by firing. According to the present invention, there takes place a liquid-phase reaction between the Zn component in the composite oxide and the B (boron) component in the sintering assistant during the firing. That is, as a result of such a liquid-phase reaction, it is made possible to obtain a dense ceramic using a sintering assistant in a small amount and through the firing at a temperature as low as 800 to 1000° C. Besides, the obtained ceramics possesses crystal phases such as an ilmenite-type crystal phase, a spineltype crystal phase, a rutile $TiO_2$-type crystal phase, a willemite-type crystal phase and an $SiO_2$-type crystal phase, minimizing the formation of an amorphous phase of grain boundaries, that is a factor for increasing the dielectric loss tangent. Therefore, the dielectric ceramics of the present invention exhibits high-frequency characteristics, i.e., exhibits a small dielectric loss tangent at a high-frequency region.

According to the present invention, therefore, it is very important from the standpoint of firing property and high-frequency property that the composition of the Zn-containing composite oxide, i.e., the ratio of the constituent metal elements satisfies the formula (1) as expressed by atomic ratios:

$$a(Zn_{1-x} \cdot Mg_x) \cdot b(Ti_{1-y} \cdot Si_y) \quad (1)$$

wherein x, y, a and b are numbers satisfying the following conditions, $0 \leq x \leq 0.75$
$0 \leq y \leq 1$
$0.14 \leq a/b \leq 3.5$ where $a/b \neq 1$ when $x=y=0$.

When x exceeds 0.75 in the above formula (1), the absolute amount of Zn becomes insufficient, the liquid-phase reaction takes place difficultly between Zn and the boron component in the sintering assistant, and it is forced to use the sintering assistant in large amounts to obtain a densely sintered product. In other words, the dielectric ceramics loses high-frequency characteristics (dielectric properties) to a conspicuous degree. To prevent this, therefore, x must be a number not larger than 0.75.

From the standpoint of decreasing the dielectric loss tangent, it is desired that x>0 or, in other words, Zn is partly substituted by Mg.

As will be understood from the fact that y is 0 to 1 in the formula (1), the Zn-containing composite oxide must contain Ti or Si. That is, with Ti or Si component being contained, it is allowed to obtain a dielectric ceramic composition exhibiting both excellent sintering property and dielectric property. Upon adjusting the value of y within this range, furthermore, it is allowed to adjust the dielectric constant. In particular, it is desired that both Ti and Si are contained in order to obtain a dielectric ceramic having a large dielectric constant.

Moreover, since the Zn-containing composite oxide must contain Ti or Si, it becomes essential that a/b in the formula (1) must be within a range of from 0.14 to 3.5. When this value is smaller than 0.14, the amount of Zn becomes so large that the dielectric properties are deteriorated. When this value exceeds 3.5, on the other hand, the amount of Zn becomes insufficient and the sintering property is lost. In this case, the sintering assistant must be used in large amounts, yet causing the dielectric properties to be deteriorated.

It is important that the dielectric ceramics of the present invention contains the above-mentioned Zn-containing composite oxide in an amount of from 85 to 99.95% by weight and $B_2O_3$ which is a sintering assistant in an amount of from 0.05 to 15% by weight.

That is, when the amount of the Zn-containing composite oxide is larger than the above-mentioned range or when the amount of the sintering assistant is smaller than the above-mentioned range, it is not allowed to obtain sufficiently dense ceramics through the firing at a temperature as low as 800 to 1000° C. Therefore, the substrate obtained by using such a composition is not so dense that the dielectric constant is very low and dielectric loss tangent is great. When the amount of the Zn-containing composite oxide is smaller than the above-mentioned range or when the amount of the sintering assistant is larger than the above-mentioned range, on the other hand, the liquid phase flows out at a temperature of not higher than 700° C. making it difficult to effect the molding. Furthermore, the dielectric loss tangent increases with a decrease in the dielectric constant.

In the present invention mentioned above, a glass containing at least $B_2O_3$ and $SiO_2$ may be contained instead of $B_2O_3$ which is the sintering assistant. Examples of such a glass may include a borosilicate glass, a zinc borosilicate glass, a lead borosilicate glass, etc. A particularly preferred glass contains 5 to 80% by weight of $SiO_2$ and 4 to 50% by weight of $B_2O_3$, and other components in suppressed amounts. For example, it is desired that $Al_2O_3$ is contained in an amount of not larger than 30% by weight, and the alkaline earth metal oxide is contained in an amount of not larger than 20% by weight. In general, these oxide components are blended at a predetermined ratio, followed by melting and cooling to obtain a mixture thereof in a vitreous state.

The above-mentioned glass exhibits quite the same action as $B_2O_3$ mentioned above. When the glass is used instead of $B_2O_3$, however, its ratio with respect to the Zn-containing composite oxide may differ. That is, in this case, the content of the Zn-containing composite oxide becomes 70 to 99.9% by weight and the consent of the glass becomes 0.1 to 30% by weight. When the content of the Zn-containing composite oxide or of the glass lies outside the above-mentioned range, there develops inconvenience quite like when $B_2O_3$ is used.

In the present invention, various compounds may be added in order to improve the property of the dielectric ceramic. For example, as the sintering assistant, at least one of alkali metal oxides such as $Li_2O$, $Na_2O$ may be contained in an amount of not larger than 5% by weight. Furthermore, a copper as a coloring agent may be contained in the form of CuO inan amount of not larger than 10% by weight. Impurity components based on elements rather than the above-mentioned metal elements may be contained in amounts of not larger than 0.5% by weight.

Upon adjusting the kinds of crystal phases formed by changing the composition of the Zn-containing composite oxide within the range satisfying the above-mentioned various conditions, the dielectric ceramics of the present invention are obtained exhibiting a variety of high-frequency characteristics such as a high dielectric constant down to a low dielectric constant in the high-frequency region, or having a further decreased dielectric loss tangent in the high-frequency region.

The dielectric ceramics are classified below depending upon the high-frequency characteristics and their compositions are described below.

(I) High-Dielectric-Constant Dielectric Ceramics:

The dielectric ceramics of this type has a dielectric constant of not smaller than 15 and a dielectric loss tangent of as small as $15 \times 10^{-4}$ or less in a high-frequency region of 30 to 60 GHz.

In general, the size of the circuit element for microwave use varies depending upon the wavelength of the electromagnetic waves. That is, when the wavelength of the electromagnetic waves propagating through vacuum is denoted by $\lambda_0$, the wavelength $\lambda$ of electromagnetic waves propagating through a dielectric having a dielectric constant $\epsilon r$ is expressed by the following formula, $$\lambda = \lambda_0 / (\epsilon r)^{1/2}$$

As will be understood from this formula, the circuit element becomes small with an increase in the dielectric constant of the dielectric substrate constituting the circuit element. In a high-frequency region, therefore, the dielectric ceramics having a large dielectric constant is very advantageous from the standpoint of realizing the circuit element in a small size.

The high-dielectric-constant dielectric ceramics can be grouped into those of the ZnMgTi-type and those of the ZnTi-type depending upon the composition of the Zn-containing composite oxide contained therein.

(I-i) ZnMgTi-type:

In the Zn-containing composite oxide contained in the ZnMgTi-type dielectric ceramics, x and y in the above-mentioned formula (1) representing the composition of the constituent metals are numbers satisfying the conditions, $0 < x \leq 0.75$, $y = 0$ That is, when expressed by atomic ratios, the composition of the constituent metals in the Zn-containing composite oxide is expressed by the following formula (1a):

$$a(Zn_{1-x} \cdot Mg_x) \cdot B(Ti) \tag{1a}$$

wherein x, a and b are numbers satisfying the following conditions, $0 < x \leq 0.75$, preferably $0.1 \leq x \leq 0.4$ $0.14 \leq a/b \leq 3.5$, preferably $0.67 \leq a/b \leq 2.0$.

That is, in this ceramics, Zn is partly substituted by Mg. Therefore, the ilmenite-type or spinel-type crystal phase containing Zn, Mg and Ti is precipitated by firing. Owing to the presence of such crystal phases, the dielectric ceramics exhibits a dielectric constant of not smaller than 15 and a small dielectric loss tangent of $15 \times 10^{-4}$ or less at the above-mentioned high-frequency region.

The ilmenite-type crystals exhibit a crystal structure that pertain to a trigonal lattice as represented by $FeTiO_3$. In the ilmenite-type crystals precipitated in the present invention, it is presumed that Fe has been substituted by Zn.

FIGS. 1 and 2 are diagrams illustrating a representative structure of the ZnMgTi-type ceramics. As shown in FIG. 1, in the ceramics of this type have been formed an ilmenite-type crystal phase (I) containing Zn, Mg and Ti and an amorphous grain boundary phase (G). There may be further formed a spinel-type crystal phase (SP) containing Zn, Mg and Ti in addition to these phases. As shown in FIG. 2, furthermore, there may be formed the ilmenite-type crystal phase (I), a spinel-type crystal phase (SP), a rutile $TiO_2$-type crystal phase (T), and the amorphous grain boundary phase (G).

The ZnMgTi-type ceramics exhibits a dielectric constant of not smaller than 15 in the high-frequency region (30 to 60 GHz). The dielectric constant is high and reaches a maximum of 80 when the ilmenite-type crystal phase is preferentially formed. When the value a/b in the above-mentioned formula (1) is smaller than 1, the ilmenite-type crystal phase is preferentially formed. As the value a/b exceeds 1, the spinel-type crystal phase is formed in large amounts. Therefore, the dielectric constant of the ceramics of this type can be adjusted to lie over a range of from 15 to 80.

In the ceramics of this type, furthermore, it is desired that the Zn-containing composite oxide is contained in an amount of from 90 to 99.9% by weight and $B_2O_3$ is contained in an amount of from 0.1 to 10% by weight. Moreover, the glass of the above-mentioned composition may be used in place of $B_2O_3$. In this case, it is desired that the Zn-containing composite oxide is contained in an amount of from 70 to 99.5% by weight and the glass is contained in an amount of from 0.5 to 30% by weight.

(I-ii) ZnTi-type:

In the Zn-containing composite oxide contained in the ZnTi-type dielectric ceramics, x and y in the above-mentioned formula (1) representing the composition of the constituent metals are numbers satisfying the condition, $x = y = 0$ That is, when expressed by atomic ratios, the composition of the constituent metals in the Zn-containing composite oxide is expressed by the following formula (1b):

$$a(Zn) \cdot B(Ti) \tag{1b}$$

wherein a and b are numbers satisfying the following conditions, $0.14 \leq a/b \leq 3.5$, preferably $0.67 \leq a/b \leq 3.5$ on condition that $a \neq 1$.

That is, in the ceramics containing the Zn-containing composite oxide having such a composition, the spinel-type or ilmenite-type crystals containing Zn and Ti, and rutile $TiO_2$-type crystals or ZnO-type crystals are precipitated upon firing at 800 to 1000° C. at the time of the production. Due to the presence of such crystal phases, the dielectric ceramics exhibits a dielectric constant of not smaller than 15 and a small dielectric loss of not larger than $15 \times 10^{-4}$ in the above-mentioned high-frequency region.

FIGS. 3 and 4 are diagrams illustrating a representative structure of the ZnTi-type ceramics. As shown in FIG. 3, in the ceramics of this type have been formed the spinel-type crystal phase (SP) containing Zn and Ti, the rutile $TiO_2$-type crystal phase (T) and the amorphous grain boundary phase (G). There may be further formed the ilmenite-type crystal phase containing Zn and Ti together with the spinel-type crystal phase (SP) or in place of the spinel-type crystal phase (SP). As shown in FIG. 4, furthermore, there may often be formed a ZnO-type crystal phase (Z) instead of the rutile $TiO_2$-type crystal phase (T). There may be formed the ZnO-type crystal phase (Z) simultaneously with the rutile $TiO_2$-type crystal phase (T), as a matter of course.

Like the above-mentioned ZnMgTi-type ceramics, the ZnTi-type ceramics exhibits a dielectric constant of not smaller than 15 in the high-frequency region (30 to 60 GHz). The dielectric constant is high and reaches a maximum of about 85 when the rutile $TiO_2$-type crystal phase (T) is formed in large amounts. Therefore, the dielectric constant can be set to be high by setting the value a/b of the above-mentioned formula (1) to be small to lie within the above-mentioned range and, by utilizing this, the dielectric constant can be adjusted to lie over a range of from 15 to 85.

In the ceramics of this type, it is desired that the Zn-containing composite oxide is contained in an amount of from 90 to 99.99% by weight and, particularly, from 95 to 99.5% by weight and $B_2O_5$ is contained in an amount of from 0.01 to 10% by weight and, particularly, from 0.5 to 5% by weight. It is further allowable to use the glass of the above-mentioned composition instead of $B_2O_3$. In this case, it is desired that the Zn-containing composite oxide is contained in an amount of from 80 to 99.5% by weight and, particularly, from 85 to 99.5% by weight and the glass is contained in an amount of from 0.5 to 20% by weight and, particularly, from 0.5 to 15% by weight.

(II) Low-Dielectric-Constant Dielectric Ceramics:

The dielectric ceramics of this type exhibits a dielectric loss tangent of not larger than $15\times10^{-4}$ in the high-frequency region of 30 to 60 GHz but also exhibits a dielectric constant of as very low as 6 or smaller unlike the above-mentioned high-dielectric-constant dielectric ceramics.

The low-dielectric-constant dielectric ceramics can be called ZnSi-type dielectric ceramics. In the Zn-containing composite oxide contained, x and y in the above-mentioned formula (1) representing the composition of the constituent metals are numbers satisfying the conditions, x=0
y=1

That is, when expressed by atomic ratios, the composition of the constituent metals in the Zn-containing composite oxide is expressed by the following formula (1c):

$$a(Zn) \cdot B(Si) \quad (1c)$$

wherein a and b are numbers satisfying the following conditions,
$0.14 \leq a/b \leq 3.5$, preferably $0.17 \leq a/b \leq 3.5$, and most preferably $0.5 \leq a/b \leq 2$.

That is, in the ceramics containing the Zn-containing composite oxide having such a composition, the willemite-type crystals ($Zn_2SiO_4$) containing Zn and Si, or the $SiO_2$-type crystals are precipitated upon firing at 800 to 1000° C. at the time of the production. Due to the presence of such crystal phases, the dielectric ceramics exhibits a dielectric constant of as low as 6 or smaller and a dielectric loss tangent of as small as $15\times10^{-4}$ or less in the above-mentioned high-frequency region.

FIG. 5 is a diagram illustrating a representative structure of the ZnSi-type ceramics. In the ceramics of this type are formed the willemite-type crystal phase (W) containing Zn and Si and the amorphous grain boundary phase (G). As shown in FIG. 5, furthermore, the $SiO_2$-type crystal phase (S) may be formed.

In the ceramics of this type, it is desired that the Zn-containing composite oxide is contained in an amount of from 85 to 99.9% by weight and, particularly, from 90 to 99% by weight, and $B_2O_3$ is contained in an amount of from 0.1 to 15% by weight and, particularly, from 1 to 10% by weight. It is further allowable to use a glass of the above-mentioned composition instead of $B_2O_3$. In this case, it is desired that the Zn-containing composite oxide is contained in an amount of from 80 to 99.5% by weight and, particularly, from 90 to 99% by weight, and the glass is contained in an amount of from 0.5 to 20% by weight and, particularly, from 1 to 10% by weight.

(III) Low-High-Dielectric-Constant Dielectric Ceramics:

The dielectric ceramics of this type exhibits a dielectric loss which is higher than that of the above-mentioned high-dielectric-constant dielectric ceramics (I) or higher than that of the above-mentioned low-dielectric-constant dielectric ceramics (II) in the high-frequency region of 30 to 60 GHz. However, the dielectric ceramics of this type exhibits a dielectric constant that varies over a range of from 5 to 80, covering those of small dielectric constants to those of large dielectric constants offering an increased degree of freedom for selecting the dielectric constant. The low-high-dielectric-constant dielectric ceramics can be grouped into those of the ZnMgTiSi-type and those of the ZnTiSi-type depending upon the composition of the Zn-containing composite oxide contained therein.

(III-i) ZnMgTiSi-type:

In the Zn-containing composite oxide contained in this dielectric ceramics, x and y in the above-mentioned formula (1) representing the composition of the constituent metals are numbers satisfying the conditions, $0<x\leq0.75$,
$0<Y<1.0$ That is, when expressed by atomic ratios, the composition of the constituent metals in the Zn-containing composite oxide is expressed by the following formula (1d):

$$a(Zn_{1-x} \cdot Mg_x) \cdot b(Ti_{1-y} \cdot Si_y) \quad (1d)$$

wherein x, y, a and b are numbers satisfying the following conditions,
$0<x\leq0.75$, preferably $0.1\leq x\leq0.4$
$0<y<1.0$
$0.14\leq a/b\leq 3.5$, preferably $0.5\leq a/b\leq 1.5$.

That is, in this ceramics, at least one of the willemite-type crystal phase ($ZnMgSiO_4$) containing Zn, Mg and Si, the ilmenite-type or spinel-type crystal phase containing Zn, Mg and Ti, the rutile $TiO_2$-type crystal phase or the $SiO_2$-type crystal phase is precipitated by firing at 800 to 1000° C. Due to the presence of such crystal phases, the dielectric ceramics exhibits a dielectric constant of from 5 to 80 and a small dielectric loss tangent of $20\times10^{-4}$ or less at the above-mentioned high-frequency region.

Figure 6:
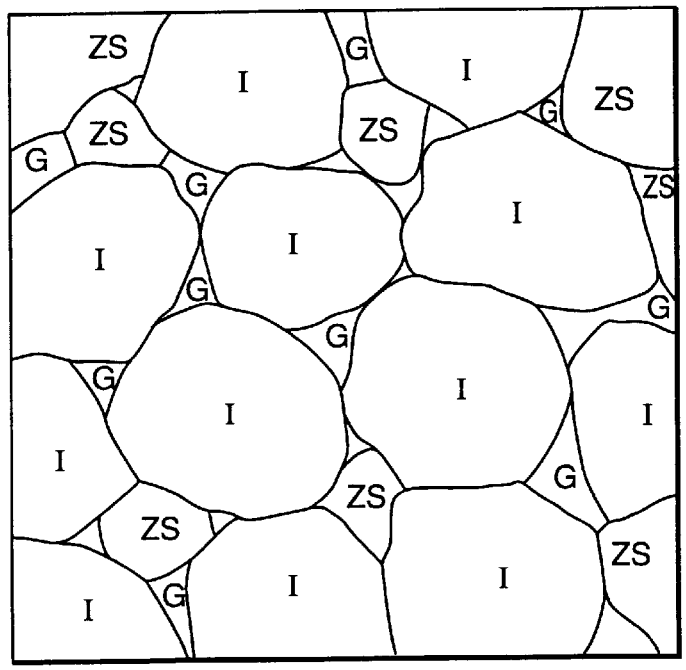
FIGS. 6 and 7 are diagrams illustrating a structure of ZnMgTiSi-type ceramics according to the present invention.
Figure 7:
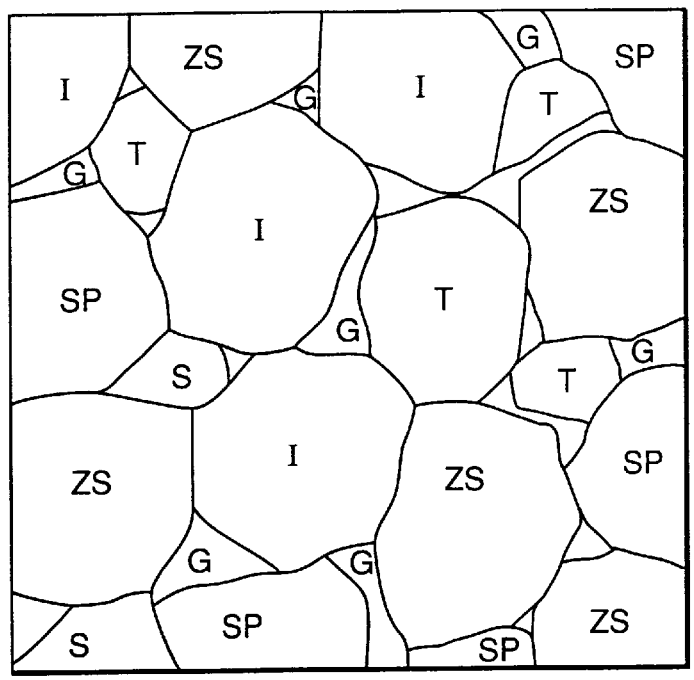

FIGS. 6 and 7 are diagrams illustrating a representative structure of the ZnMgTiSi-type ceramics. Referring to FIG. 6, in the ceramics are formed the ilmenite-type crystal phase (I) containing Zn, Mg and Ti, the willemite-type crystal phase (ZnS) containing Zn, Mg and Si, and the amorphous grain boundary phase (G). There may be further formed the spinel-type crystal phase (SP) containing Zn, Mg and Ti in addition to these phases. Referring to FIG. 7, furthermore, there may be often formed the rutile $TiO_2$-type crystal phase (T) and the $SiO_2$-type crystal phase (S) in addition to the phases shown in FIG. 6.

In the ZnMgTiSi-type ceramics, in general, the crystal phase of the rutile $TiO_2$-type, the spinel-type or the ilmenite-type may be formed in large amounts to increase the dielectric constant, and the crystal phase of the $SiO_2$-type or the willemenite-type may be formed in large amounts to decrease the dielectric constant.

In the ceramics of this type, furthermore, it is desired that the Zn-containing composite oxide is contained in an amount of from 80 to 99.95% by weight and, particularly, from 90 to 99.9% by weight, and $B_2O_3$ is contained in an amount of from 0.05 to 20% by weight and, particularly, from 0.1 to 10% by weight. It is further allowable to use a glass of the above-mentioned composition instead of $B_2O_3$. In this case, it is desired that the Zn-containing composite oxide is contained in an amount of from 70 to 99.5% by weight and, particularly, from 80 to 99.5% by weight and the glass is contained in an amount of from 0.5 to 30% by weight and, particularly, from 0.5 to 20% by weight.

(III-ii) ZnTiSi-type:

In the Zn-containing composite oxide contained in this dielectric ceramics, x and y in the above-mentioned formula (1) representing the composition of the constituent metals are numbers satisfying the conditions, x=0

0<y<1.0.

That is, when expressed by atomic ratios, the composition of the constituent metals in the Zn-containing composite oxide is expressed by the following formula (1e):

$$a(Zn) \cdot b(Ti_{1-y} \cdot Si_y) \tag{1e}$$

wherein y, a and b are numbers satisfying the following conditions,

0<Y<1.0

$0.14 \leq a/b \leq 3.5$, preferably $0.5 \leq a/b \leq 1.5$.

That is, in this ceramics, at least one of the willemite-type crystal phase ($Zn_2SiO_4$) containing Zn and Si, the ilmenite-type or spinel-type crystal phase containing Zn and Ti, the rutile $TiO_2$-type crystal phase or the $SiO_2$-type crystal phase is precipitated by firing at 800 to 1000° C. Due to the presence of such crystal phases, the dielectric ceramics exhibits a dielectric constant of from 5 to 80 and a dielectric loss tangent of $30 \times 10^{-4}$ or less at the above-mentioned high-frequency region.

Figure 8:
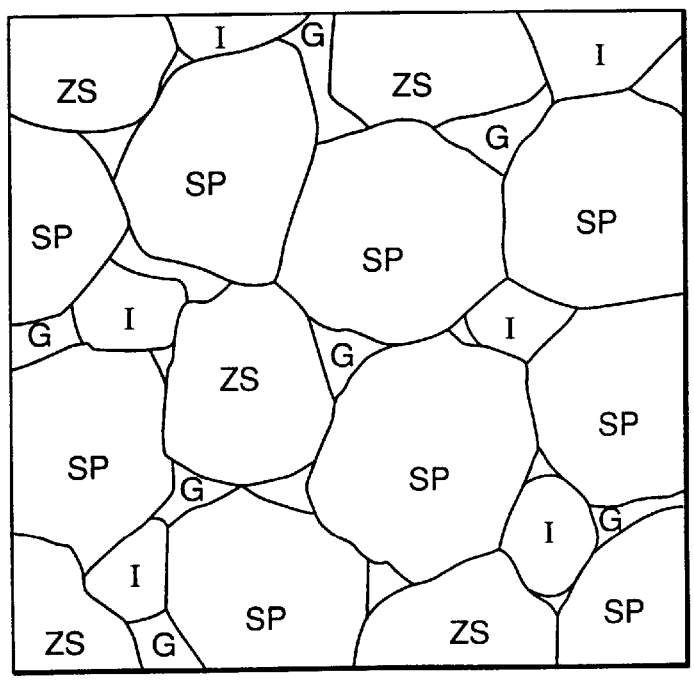
FIGS. 8 and 9 are diagram illustrating a structure of ZnTiSi-type ceramics according to the present invention.
Figure 9:
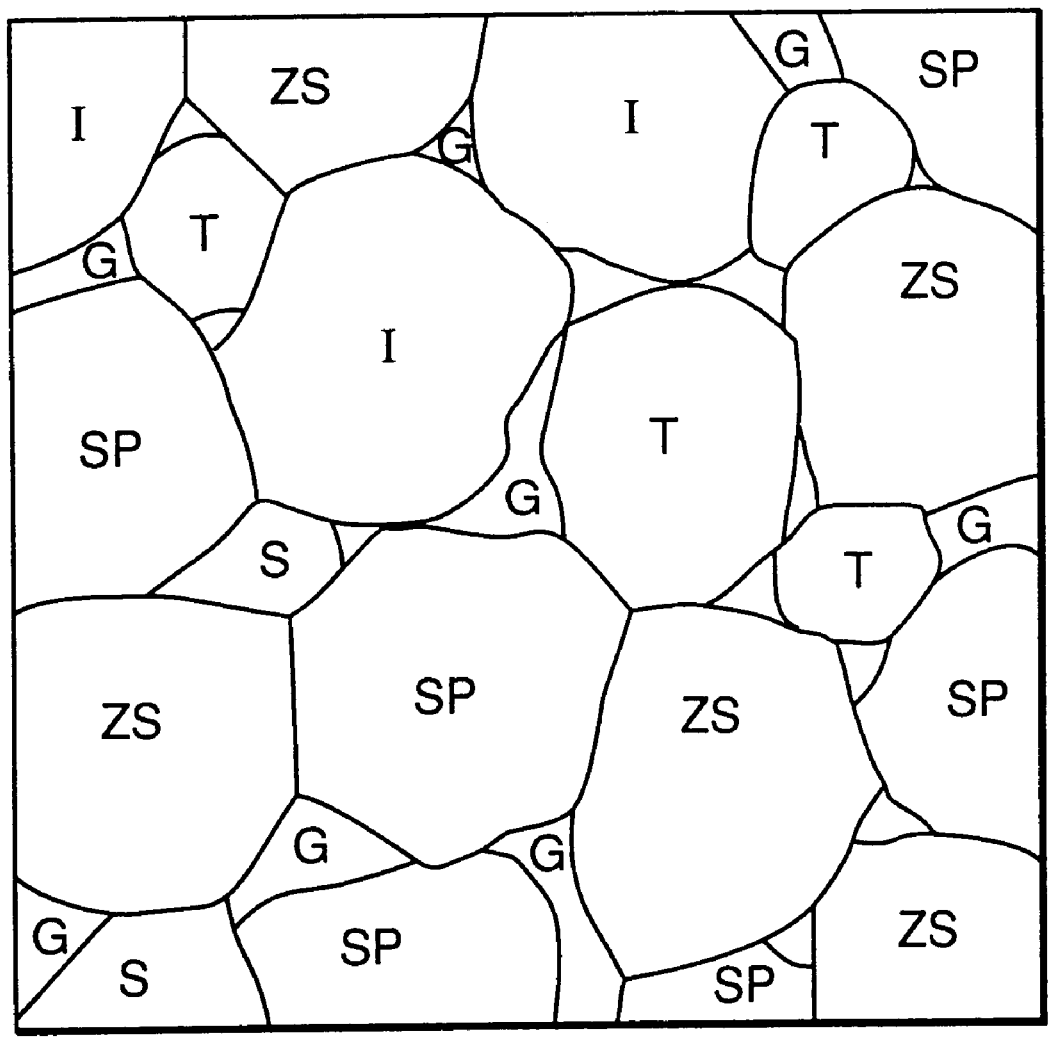

FIGS. 8 and 9 are diagrams illustrating a representative structure of the ZnTiSi-type ceramics. Referring to FIG. 8, in the ceramics are formed the willemite-type crystal phase (ZnS) containing Zn and Ti, the ilmenite-type crystal phase (I) containing Zn and Ti, and the amorphous grain boundary phase (G). Referring to FIG. 9, furthermore, there are formed the rutile $TiO_2$-type crystal phase (T) and the $SiO_2$-type crystal phase (S) in addition to the phases shown in FIG. 8.

In the ZnTiSi-type ceramics, in general, the crystal phase of the rutile $TiO_2$-type, the spinel-type or the ilmenite-type may be formed in large amounts to increase the dielectric constant, and the crystal phase of the rutile $TiO_2$-type or the willemenite-type may be formed in large amounts to decrease the dielectric constant.

In the ceramics of this type, furthermore, it is desired that the Zn-containing composite oxide is contained in an amount of from 80 to 99.95% by weight and, particularly, from 90 to 99.9% by weight, and $B_2O_3$ is contained in an amount of from 0.05 to 20% by weight and, particularly, from 0.1 to 10% by weight. It is further allowable to use a glass of the above-mentioned composition instead of $B_2O_3$. In this case, it is desired that the Zn-containing composite oxide is contained in an amount of from 70 to 99.9% by weight and, particularly, from 80 to 99.5% by weight and the glass is contained in an amount of from 0.5 to 30% by weight and, particularly, from 0.5 to 20% by weight.

(Preparation of the Dielectric Ceramics)

The dielectric ceramics of the present invention is prepared by mixing powders of oxides (e.g., ZnO, MgO, $TiO_2$, $SiO_2$) containing various metals such as Zn, Mg, Ti and Si at such a ratio as to satisfy the atomic ratio of the above-mentioned formula (1). Instead of using these metal oxides, it is also allowable to use a composite oxide containing two or more of such metals, such as $ZnTiO_3$, $Zn_2TiO_4$, $MgTiO_3$, $Mg_2TiO_4$, $MgSiO_3$, $Mg_2SiO_4$, $ZnSiO_3$, $Zn_2SiO_4$, etc. It is also allowable to use carbonates, acetates or nitrates of the above-mentioned metals so far as they are capable of forming oxides in the step of sintering.

The powders of the above-mentioned metal oxides are further blended with the $B_2O_3$ powder or the above-mentioned glass powder as a sintering assistant. Instead of the $B_2O_3$ powder, there may be used a boron compound that forms $B_2O_3$ in the sintering step, such as $B_2S_3$, $H_2BO_3$, BN, $B_4C$, etc. The ratio for mixing the powders of the metal oxides and the sintering assistant is so as to satisfy the ratio of the above-mentioned Zn-containing composite oxide and $B_2O_3$ or the glass.

It is desired that the starting material powders have an average particle diameter of not larger than 2 $\mu$m and, particularly, not larger than 1.0 $\mu$m. Use of such fine powders makes it possible to prepare a mixture powder in which the starting material powders are uniformly dispersed. As a result, it is made possible to obtain the dielectric ceramics without dispersion in the dielectric constant or in the dielectric loss tangent.

The thus obtained mixture powder is mixed with a suitable binder and is molded into a predetermined shape. After the binder is removed, the mixture powder is fired to obtain desired dielectric ceramics.

As the molding means, there can be employed any known method, such as metal mold press, cold hydrostatic press, extrusion molding, doctor blade method, rolling method or the like method.

The firing is effected in a nonoxidizing atmosphere such as of nitrogen, argon, etc., or in an oxidizing atmosphere such as the air or the like. The firing temperature ranges from 800 to 1000° C. and, particularly, from 900 to 1000° C. When the firing temperature is lower than 800° C., the ceramics is not obtained in a sufficiently dense form through the firing. When the firing temperature is higher than 1000° C., on the other hand, the ceramics are no longer fired together with low-resistance metals such as copper, silver, etc. The firing time may be from about 0.1 to about 5 hours. Through such a firing, the dielectric ceramics is obtained having a relative density of not smaller than 95%. When the ceramics is to be fired together with copper, it is desired that the firing is conducted in a nonoxidizing atmosphere. When the ceramics is to be fired together with silver, it is desired that the firing is conducted in an oxidizing atmosphere.

(Use)

The thus obtained dielectric ceramics of the present invention has a small dielectric loss tangent in the high-frequency region, and can be obtained through firing together with low-resistance metals such as, copper, silver, etc., and is very useful for the production of wiring boards of various electronic equipment adapted for use at high frequencies.

By using the above-mentioned mixture powder, for example, a green sheet is formed for forming an insulating layer by a tape-forming method such as doctor blade method, rolling method or the like method. Onto the green sheet is applied, in the form of a circuit pattern, an electrically conducting paste containing a low-resistance metal such as gold, silver, copper, etc. by utilizing a screen printing method or a gravure printing method. Then, as required, through-holes or via-holes are formed in the green sheet, and these holes are filled with an electrically conducting paste. Then, the plurality of green sheets are laminated and adhered with pressure, and are simultaneously fired under the above-mentioned conditions thereby to prepare an insulating board equipped with a wiring layer (conducting circuit), i.e., to prepare a wiring board at one time.

EXAMPLES

Examples of the invention will now be described.

Example 1

A $B_2O_3$ powder, a $Zn_2TiO_4$ powder and a $MgTiO_3$ powder (each powder has an average particle diameter of not larger than 1 μm) were mixed together in compliance with the compositions shown in Table 1. To the mixtures were added an organic binder, a plasticizer and toluene, and green sheets of a thickness of 300 μm were prepared by the doctor blade method. Five green sheets were laminated one upon the other, and were adhered together at a temperature of 50° C. under a pressure of 100 kg/cm². The binder was removed from the thus obtained laminates in a water vapor-containing nitrogen atmosphere at 500 to 700° C. The laminates were then fired in dry nitrogen under the conditions of Table 1 to obtain ceramics for multi-layer substrates.

Figure 10:
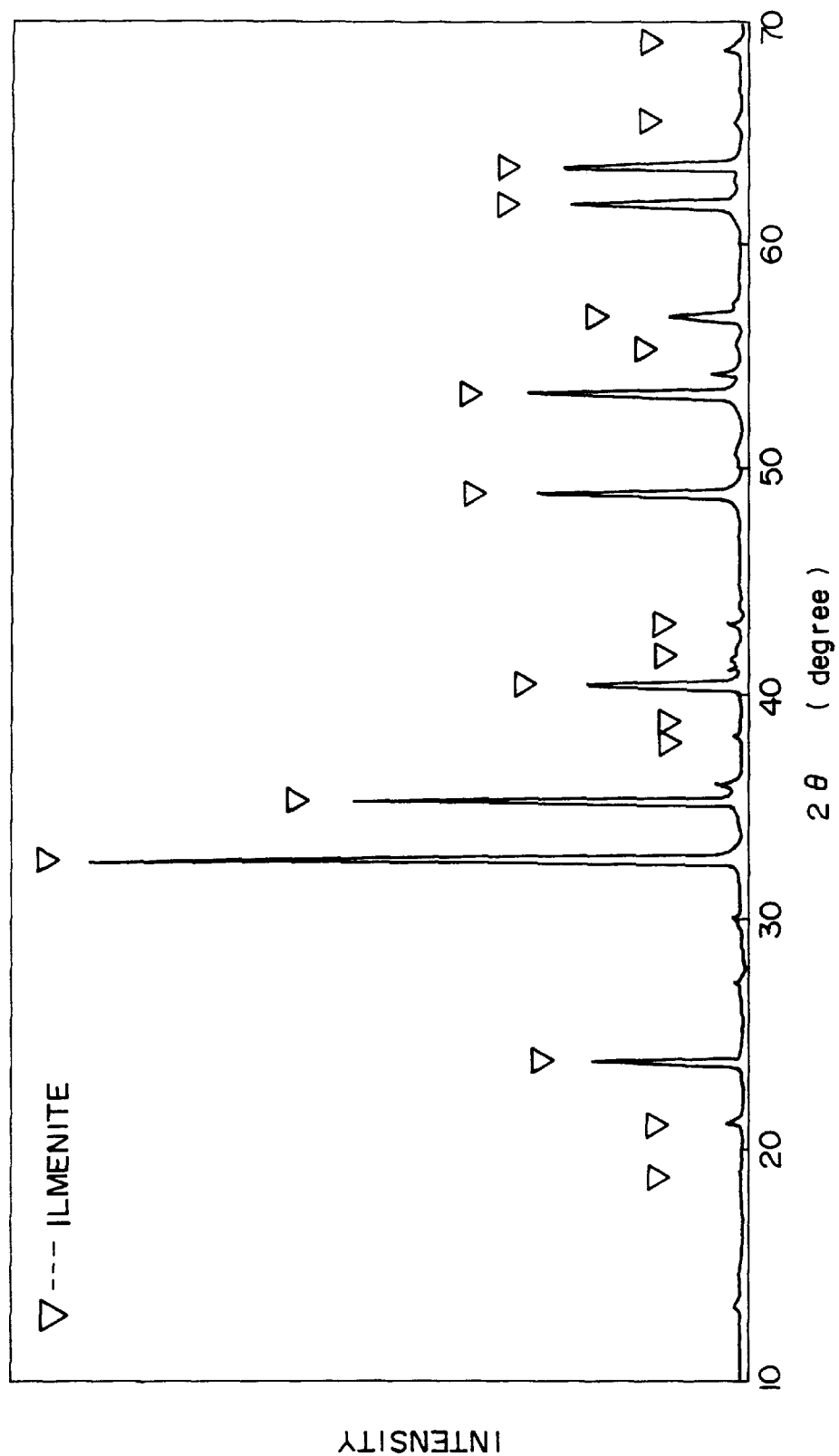
FIG. 10 is an X-ray diffraction chart of a sample No. 1-9 of Example 1.

The obtained sintered products were evaluated for their dielectric constants and dielectric loss tangents according to a method described below. Samples were cut into a size of a diameter of 1 to 5 mm and a thickness of 2 to 3 mm, which were then measured relying upon a dielectric cylinder resonator method at 60 GHz by using a network analyzer and a synthesized sweeper. To take a measurement, the dielectric resonator was excited with an NRD guide (nonradiating dielectric line), and the dielectric constants and the dielectric loss tangents were calculated from the resonance characteristics in the TE021- and TE031-modes. The results of measurements were as shown in Table 1. The constituent phases of the ceramics were identified from the measurement of X-ray diffraction. FIG. 10 is an X-ray diffraction chart of a sample No. 1-9.

As comparative examples, the sintered products were prepared by using $SrTiO_3$ and $CaTiO_3$ instead of $Zn_2TiO_4$ and $MgTiO_3$, and were evaluated (samples Nos. 1-25 and 1-26).

TABLE 1

$(0 < x \leq 0.75, y = 0)$

| Sample No. | x | a/b | Blended amount (wt %) | Amount of $B_2O_3$ (wt %) | Firing condition Temp. (°C.) | Time (hr) | Dielectric constant εr | Dielectric loss tangent tanδ ×10⁻⁴ | Phases (note 1) |
|---|---|---|---|---|---|---|---|---|---|
| *1-1 | 0.05 | 1.0 | 99.99 | 0.01 | 1300 | 10 | could not be measured | | — |
| 1-2 | 0.05 | 1.0 | 99.9 | 0.1 | 1000 | 5 | 29.0 | 8 | SP>I>T>>G |
| 1-3 | 0.05 | 1.0 | 99.7 | 0.3 | 990 | 5 | 28.5 | 6 | SP>I>T>>G |
| 1-4 | 0.05 | 1.0 | 95.0 | 5.0 | 900 | 3 | 25.0 | 10 | SP>I>T>>G |
| 1-5 | 0.05 | 1.0 | 90.0 | 10.0 | 900 | 1 | 23.0 | 15 | SP>I>T>>G |
| *1-6 | 0.05 | 1.0 | 75.0 | 25.0 | 850 | 1 | could not be measured | | SP>G |
| 1-7 | 0.10 | 1.0 | 99.5 | 0.5 | 1000 | 1 | 23.0 | 5 | SP>I>T>>G |
| 1-8 | 0.10 | 1.0 | 99.0 | 1.0 | 900 | 1 | 20.0 | 6 | SP>I>T>>G |
| 1-9 | 0.20 | 1.0 | 99.5 | 0.5 | 990 | 2 | 22.0 | 3 | I>>G |
| 1-10 | 0.20 | 1.0 | 95.0 | 5.0 | 950 | 1 | 20.0 | 4 | I>>G |
| 1-11 | 0.20 | 1.0 | 90.0 | 10.0 | 875 | 1 | 18.0 | 9 | I>>G |
| 1-12 | 0.20 | 10 | 99.0 | 1.0 | 900 | 1 | could not be measured | | SP>Z>>G |
| 1-13 | 0.20 | 3.3 | 99.5 | 0.5 | 950 | 1 | 17.0 | 5 | |
| 1-14 | 0.20 | 2.0 | 99.5 | 0.5 | 975 | 1 | 19.0 | 4 | I>>G |
| 1-15 | 0.20 | 0.3 | 99.0 | 1.0 | 950 | 1 | 47.0 | 9 | I>T>>G |
| 1-16 | 0.20 | 0.2 | 95.0 | 5.0 | 950 | 1 | 60.0 | 9 | I>T>>G |
| 1-17 | 0.20 | 0.14 | 90.0 | 10.0 | 950 | 3 | 79.0 | 14 | I>T>>G |
| *1-18 | 0.20 | 0.125 | 80.0 | 20.0 | 1200 | 1 | could not be measured | | I,T>>G |
| 1-19 | 0.25 | 1.0 | 98.0 | 2.0 | 1000 | 1 | 23.0 | 3 | I>>G |
| 1-20 | 0.25 | 1.0 | 97.0 | 3.0 | 975 | 2 | 22.5 | 5 | I>>G |
| 1-21 | 0.50 | 1.0 | 95.0 | 5.0 | 1000 | 1 | 22.0 | 4 | I>>G |
| 1-22 | 0.50 | 1.0 | 93.0 | 7.0 | 1000 | 1 | 21.5 | 5 | I>>G |
| 1-23 | 0.75 | 1.0 | 85.0 | 15.0 | 975 | 1 | 15 | 10 | I>T>>G |
| *1-24 | 0.90 | 1.0 | 70.0 | 30.0 | 975 | 1 | 10 | 200 | I>T>G |
| *1-25 | $SrTiO_3$ | | 70.0 | 30.0 | 1000 | 3 | could not be measured | | ST>G |
| *1-26 | CaTiO | | 75.0 | 25.0 | 1000 | 3 | could not be measured | | CT>G |

Samples marked with * lie outside the scope of the invention.
Note 1)
SP: Spinel-type crystal phase $(Zn, Mg)_2TiO_4$
G: amorphous phase
I: Ilmenite-type crystal phase $(Zn, Mg)TiO_3$
CT: $CaTiO_3$ crystal phase
T: $TiO_2$ crystal phase
ST: $SrTiO_3$ crystal phase
Z: ZnO crystal phase As will be obvious from the results of Table 1, the ceramics of the invention in which the ilmenite-type crystal phase $((Zn, Mg)TiO_3)$ or the spinel-type crystal phase $((Zn, Mg)_2TiO_4)$ has chiefly precipitated, exhibited excellent properties such as a dielectric constant of 15 to 30 and a dielectric loss tangent of not larger than $15 \times 10^{-4}$ at 60 GHz, and could be sintered at 800 to 1000° C. As a result of analyzing the crystalline grain boundary phase of the ceramic products of the invention by using an X-ray microanalyzer, Zn and B were detected from the grain boundary phase.

On the other hand, a sample No. 1-1 containing $B_2O_3$ in an amount of smaller than 0.05% by weight could not be obtained in a dense form unless the firing temperature was increased to 1300° C., and was not suited for the object of the present invention. On the other hand, a sample No. 1-6 containing $B_2O_3$ in an amount in excess of 20% by weight contained the liquid phase in such a large amount that the dielectric loss tangent was great, and the dielectric properties at 60 GHz could not be evaluated.

In a sample No. 1-12 (a/b>3.5) containing Ti at a small ratio relative to (Zn+Mg), the ZnO phase precipitated to an excess degree. Therefore, the dielectric loss tangent was so great that the dielectric properties could not be evaluated at 60 GHz. A sample No. 1-18 (a/b<0.14) containing Ti at a large ratio relative to (Zn+Mg) could not be obtained in a dense form unless the sintering temperature was increased to 1200° C., and was not suited for the object of the present invention.

In a sample No. 1-24 in which x>0.75, the amount of Zn was not sufficient, and the liquid phase was not formed with B in $B_2O_3$. Therefore, the ceramics could not be obtained in a dense form unless $B_2O_3$ was added in an amount in excess of 15% by weight, and poor dielectric properties were exhibited.

In samples Nos. 1-25 and 1-26 using $SrTiO_3$ and $CaTiO_3$, which were Comparative Examples, the dielectric loss tangents were so large that the properties could not be measured at 60 GHz.

Example 2

A glass powder shown in Table 2 having an average particle diameter of not larger than 1 μm, and $Zn_2TiO_4$ and $MgTiO_3$ having average particle diameters of not larger than 1 μm, were mixed together in compliance with the compositions shown in Table 3. By using these mixtures, green sheets were prepared in the same manner as in Example 1. Five green sheets were laminated one upon the other and were adhered together at a temperature of 50° C. under a pressure of 100 kg/cm². The binder was removed from the thus obtained laminates in a water vapor-containing nitrogen atmosphere at 700° C. Thereafter, the laminates were fired in dry nitrogen under the conditions of Tables 3 and 4 to obtain ceramics for multi-layer substrates.

Figure 11:
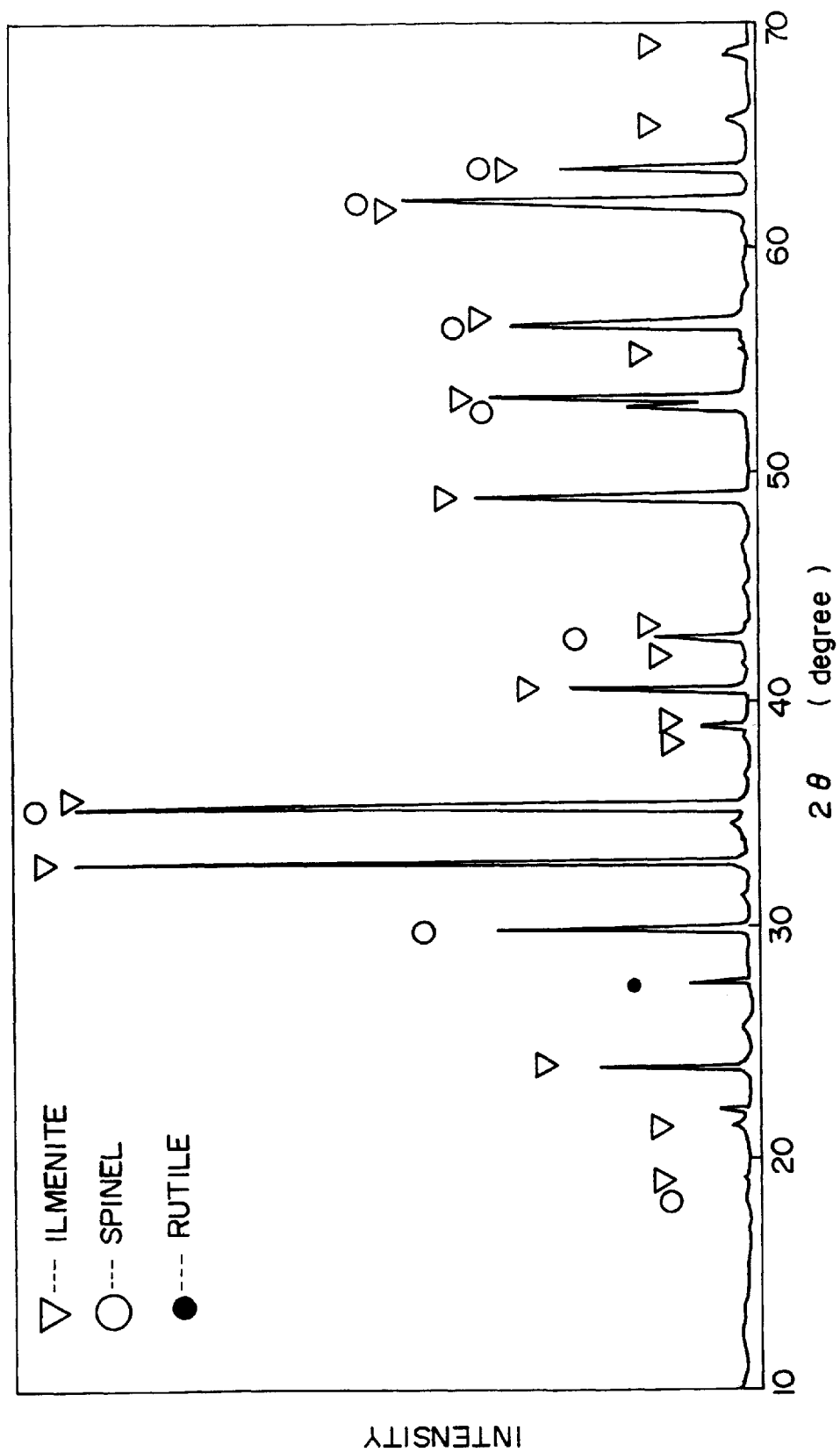
FIG. 11 is an X-ray diffraction chart of a sample No. 1-29 of Example 2.

The obtained sintered products were evaluated for their dielectric constants and dielectric loss tangents by the same method as that of Example 1. The results of measurement were as shown in Tables 3 and 4. The phases constituting the ceramics were identified from the measurement of X-ray diffraction. FIG. 11 is an X-ray diffraction chart of a sample No. 1-29.

TABLE 2

| No. | $SiO_2$ | $B_2O_3$ | $Al_2O_3$ | ZnO | MgO | CaO | BaO | Alkali metal | | Others | |
|---|---|---|---|---|---|---|---|---|---|---|---|
| A | 10.4 | 45.3 | 2.5 | 35.2 | — | — | — | $Na_2O$ | 6.6 | — | |
| B | 9.5 | 44.0 | 4.5 | 33.5 | — | — | — | $K_2O$ | 8.5 | — | |
| C | 53.0 | — | 5.0 | 4.5 | 14.5 | 23.0 | — | | | — | |
| D | 47.5 | — | 8.5 | — | 18.0 | 4.5 | 20.0 | $Li_2O$ | 1.5 | — | |
| E | 44.0 | 9.0 | 29.0 | 7.0 | 11.0 | — | — | | | — | |
| F | 12.0 | 22.6 | 22.7 | — | 0.3 | 13.2 | — | $K_2O$ | 1.4 | $ZrO_2$ | 3.3 |
| | | | | | | | | $Na_2O$ | 6.7 | $TiO_2$ | 1.8 |
| | | | | | | | | $Li_2O$ | 12.5 | SnO | 3.5 |
| G | 66.3 | 19.2 | 6.7 | — | — | — | 3.2 | $K_2O$ | 2.4 | — | |
| | | | | | | | | $Na_2O$ | 2.2 | | |
| H | 18.7 | 31.1 | — | — | — | 20.5 | 23.2 | $Li_2O$ | 6.5 | — | |
| I | 79.7 | 18.3 | — | — | — | — | — | $K_2O$ | 2.0 | — | |
| J | 36.0 | 24.9 | 3.5 | 17.1 | 12.6 | — | — | $K_2O$ | 0.5 | F | 0.16 |
| | | | | | | | | $Na_2O$ | 5.1 | SrO | 0.14 |
| K | 50.0 | 4.5 | 6.3 | 2.2 | 11.8 | 25.2 | — | — | | — | |
| L | 48.0 | 23.4 | 19.1 | — | — | 7.5 | — | — | | $ZrO_2$ | 2.0 |

TABLE 3

$(0 < x \leq 0.75, y = 0)$

| Sample No. | x | a/b | Blended amount (wt %) | Amount of glass Kind | (wt %) | Firing condition Temp. (°C.) | Time (hr) | Dielectric constant ε r | Dielectric loss tangent tanδ ×10⁻⁴ | Phases (note 1) |
|---|---|---|---|---|---|---|---|---|---|---|
| *1-27 | — | 1.0 | 95.0 | A | 5.0 | 950 | 1 | 25.0 | 11 | SP>I>T>>G |
| *1-28 | 0.05 | 1.0 | 99.95 | A | 0.05 | 1300 | 1 | — | — | — |
| 1-29 | 0.05 | 1.0 | 99.0 | A | 1.0 | 1000 | 1 | 29.0 | 7 | SP>I>T>>G |
| 1-30 | 0.05 | 1.0 | 95.0 | A | 5.0 | 950 | 1 | 26.5 | 9 | SP>I>T>>G |
| 1-31 | 0.05 | 1.0 | 90.0 | A | 10.0 | 950 | 1 | 24.0 | 12 | SP>I>T>>G |
| 1-32 | 0.05 | 1.0 | 80.0 | A | 20.0 | 900 | 3 | 22.0 | 13 | SP>I>T>>G |
| 1-33 | 0.05 | 1.0 | 70.0 | A | 30.0 | 880 | 1 | 17.0 | 15 | SP>I>T>>G |
| *1-34 | 0.05 | 1.0 | 65.0 | A | 35.0 | 850 | 1 | could not be measured | | SP>G |
| 1-35 | 0.10 | 1.0 | 99.5 | A | 0.5 | 1000 | 1 | 24.0 | 6 | SP>I>T>>G |
| 1-36 | 0.10 | 1.0 | 99.0 | A | 1.0 | 950 | 1 | 22.0 | 7 | SP>I>T>>G |
| 1-37 | 0.20 | 1.0 | 99.0 | A | 1.0 | 975 | 1 | 21.0 | 5 | I>>G |
| 1-38 | 0.20 | 1.0 | 95.0 | A | 5.0 | 950 | 1 | 19.0 | 4 | I>>G |
| 1-39 | 0.20 | 1.0 | 90.0 | A | 10.0 | 900 | 1 | 17.0 | 6 | I>>G |
| *1-40 | 0.20 | 10 | 99.0 | A | 1.0 | 950 | 1 | could not be measured | | SP>Z |
| 1-41 | 0.20 | 3.3 | 98.0 | A | 2.0 | 975 | 1 | 19.0 | 6 | I>SP>>G |

TABLE 3-continued (0 < x ≤ 0.75, y = 0)

| Sample No. | x | a/b | Blended amount (wt %) | Amount of glass Kind | Amount of glass (wt %) | Firing condition Temp. (°C.) | Firing condition Time (hr) | Dielectric constant εr | Dielectric loss tangent tanδ ×10⁻⁴ | Phases (note 1) |
|---|---|---|---|---|---|---|---|---|---|---|
| 1-42 | 0.20 | 2.0 | 98.0 | A | 2.0 | 1000 | 1 | 18.0 | 5 | I>SP>>G |
| 1-43 | 0.20 | 0.3 | 98.0 | A | 2.0 | 975 | 1 | 43.0 | 8 | I>T>>G |
| 1-44 | 0.20 | 0.2 | 95.0 | A | 5.0 | 990 | 1 | 65.0 | 10 | I>T>>G |
| 1-45 | 0.20 | 0.14 | 85.0 | A | 15.0 | 975 | 1 | 75.0 | 15 | T>I>>G |
| *1-46 | 0.20 | 0.125 | 70.0 | A | 30.0 | 1200 | 1 | — | — | I>T>>G |
| 1-47 | 0.25 | 1.0 | 95.0 | A | 5.0 | 950 | 1 | 21.0 | 4 | I>>G |

Samples marked with * lie outside the scope of the invention.
Note 1)
SP: Spinel-type crystal phase $(Zn, Mg)_2TiO_4$
G: amorphous phase
I: Ilmenite-type crystal phase $(Zn, Mg)TiO_3$
CT: $CaTiO_3$ crystal phase
T: $TiO_2$ crystal phase
ST: $SrTiO_3$ crystal phase
Z: $ZnO$ crystal phase

TABLE 4

(0 < x ≤ 0.75, y = 0)

| Sample No. | x | a/b | Blended amount (wt %) | Amount of glass Kind | Amount of glass (wt %) | Firing condition Temp. (°C.) | Firing condition Time (hr) | Dielectric constant εr | Dielectric loss tangent tanδ ×10⁻⁴ | Phases (note 1) |
|---|---|---|---|---|---|---|---|---|---|---|
| 1-48 | 0.25 | 1.0 | 90.0 | A | 10.0 | 900 | 3 | 18.0 | 8 | I>>G |
| 1-49 | 0.50 | 1.0 | 85.0 | A | 15.0 | 975 | 1 | 19.0 | 5 | I>>G |
| 1-50 | 0.50 | 1.0 | 75.0 | A | 25.0 | 975 | 1 | 18.0 | 7 | I>>G |
| 1-51 | 0.75 | 1.0 | 70.0 | A | 30.0 | 1000 | 1 | 17.0 | 10 | I>T>>G |
| *1-52 | 0.90 | 1.0 | 60.0 | A | 40.0 | 1000 | 1 | 13.0 | 250 | I>T>G |
| *1-53 | SrTiO₃ |  | 65.0 | A | 35.0 | 1000 | 1 | — | — | ST>G |
| *1-54 | CaTiO₃ |  | 70.0 | A | 30.0 | 1000 | 1 | — | — | CT>G |
| 1-55 | 0.10 | 1.0 | 98.0 | B | 2.0 | 985 | 1 | 26.0 | 9 | SP>I>T>>G |
| 1-56 | 0.20 | 1.0 | 95.0 | B | 5.0 | 950 | 1 | 19.0 | 5 | I>>G |
| 1-57 | 0.25 | 1.0 | 95.0 | B | 5.0 | 900 | 3 | 18.0 | 4 | I>>G |
| 1-58 | 0.30 | 1.0 | 90.0 | B | 10.0 | 950 | 1 | 18.0 | 6 | I>>G |
| *1-59 | 0.20 | 1.0 | 70.0 | C | 30.0 | 1250 | 3 | — | — | — |
| *1-60 | 0.20 | 1.0 | 70.0 | D | 30.0 | 1300 | 2 | — | — | — |
| 1-61 | 0.25 | 1.0 | 95.0 | E | 5.0 | 990 | 1 | 21.0 | 5 | I>>G |
| 1-62 | 0.25 | 1.0 | 96.0 | F | 4.0 | 975 | 1 | 19.0 | 5 | I>>G |
| 1-63 | 0.25 | 1.0 | 97.0 | G | 3.0 | 975 | 1 | 19.0 | 6 | I>>G |
| 1-64 | 0.25 | 1.0 | 95.0 | H | 5.0 | 950 | 1 | 18.0 | 6 | I>>G |
| 1-65 | 0.25 | 1.0 | 98.0 | I | 2.0 | 1000 | 1 | 21.0 | 7 | I>>G |
| 1-66 | 0.25 | 1.0 | 97.0 | J | 3.0 | 980 | 1 | 20.0 | 5 | I>>G |
| 1-67 | 0.25 | 1.0 | 99.0 | K | 1.0 | 1000 | 1 | 22.0 | 7 | I>>G |
| 1-68 | 0.25 | 1.0 | 97.0 | L | 3.0 | 990 | 1 | 21.0 | 5 | I>>G |

Samples marked with * lie outside the scope of the invention.
Note 1)
SP: Spinel-type crystal phase $(Zn, Mg)_2TiO_4$
G: amorphous phase
I: Ilmenite-type crystal phase $(Zn, Mg)TiO_3$
CT: $CaTiO_3$ crystal phase
T: $TiO_2$ crystal phase
ST: $SrTiO_3$ crystal phase
Z: $ZnO$ crystal phase As will be obvious from the results of Tables 2 to 4, the ceramics of the invention in which the ilmenite-type crystal phase $((Zn, Mg)TiO_3)$ or the spinel-type crystal phase $((Zn, Mg)_2TiO_4)$ has chiefly precipitated, exhibited excellent properties such as a dielectric constant of 15 to 80 and a dielectric loss tangent of not larger than $15 \times 10^{-4}$ at 60 GHz, and could be sintered at 800 to 1000° C. As a result of analyzing the crystalline grain boundary phase of the ceramic products of the invention by using an X-ray microanalyzer, Zn and B were detected from the grain boundary phase.

On the other hand, a sample No. 1-28 containing the glass in an amount of smaller than 0.1% by weight could not be obtained in a dense form unless the firing temperature was increased to 1300° C., and was not suited for the object of the present invention. On the other hand, a sample No. 1-34 containing the glass in an amount in excess of 30% by weight contained the liquid phase in such a large amount that the dielectric loss tangent was great, and the dielectric properties at 60 GHz could not be evaluated.

In a sample No. 1-40 (a/b>3.5) containing Ti at a small ratio relative to (Zn+Mg), the ZnO phase precipitated to an excess degree. Therefore, the dielectric loss tangent was so great that the dielectric properties could not be evaluated at 60 GHz. A sample No. 1-46 (a/b<0.14) containing Ti at a large ratio relative to (Zn+Mg) could not be obtained in a dense form unless the sintering temperature was increased to 1200° C., and was not suited for the object of the present invention.

In a sample No. 1-52 in which x>0.75, the amount of Zn was not sufficient, and the liquid phase was not formed with B in the glass. Therefore, the ceramics could not be obtained in a dense form unless the glass was added in an amount in excess of 30% by weight, and poor dielectric properties were exhibited.

Example 3

By using various ceramics, cylindrical samples (a) were prepared in a size of a diameter of 1 to 30 mm and a thickness of 2 to 15 mm. The ceramics No. 1-9 of Example 1, the ceramics of No. 1-38 of Example 2, and, as Comparative Examples, a cordierite-type glass ceramics (75% by weight of borosilicate glass and 25% by weight of $Al_2O_3$) which is a general-purpose product and alumina ceramics (95% by weight of $Al_2O_3$ and 5% by weight of CaO, MgO) for general use, were measured for their dielectric constants and dielectric loss tangents by the dielectric cylindrical resonator method at high frequencies of 1 GHz, 10 GHz, 20 GHz, 30 GHz and 60 GHz and in the microwave and millimeter wave regions.

As a result, the cordierite-type glass ceramics which is a general-purpose product exhibited a dielectric constant of as considerably low as 5, and the low-purity alumina for general use exhibited a dielectric constant of as low as 9. On the other hand, the ceramic products of the present invention exhibited dielectric constants of as high as 19 and 22. The glass ceramics which is a general-purpose product exhibits a small dielectric loss tangent in a low-frequency region but exhibits deteriorated properties in a high-frequency region and exhibits a dielectric loss tangent of not smaller than $30 \times 10^{-4}$ at a frequency of not lower than 40 GHz. The alumina ceramics for general use, too, exhibited a dielectric loss tangent of as large as $30 \times 10^{-4}$ at about 50 GHz. On the other hand, the products of the present invention exhibited a dielectric loss tangent of as small as $5 \times 10^{-4}$ or less in a high-frequency region of 60 GHz.

Example 4

A $B_2O_3$ powder having an average particle size of not larger than 1 µm, and a ZnO powder and a $TiO_2$ powder having an average particle diameter of not larger than 1 µm, were mixed together in compliance with the compositions shown in Table 1. To the mixtures were added an organic binder, a plasticizer and toluene, and green sheets of a thickness of 300 µm were prepared by the doctor blade method. Five green sheets were laminated one upon the other, and were adhered together at a temperature of 50° C. under a pressure of 100 kg/cm². The binder was removed from the thus obtained laminates in a water vapor-containing nitrogen atmosphere at 500 to 700° C. The laminates were then fired in dry nitrogen under the conditions of Table 5 to obtain ceramics for multi-layer substrates.

Figure 12:
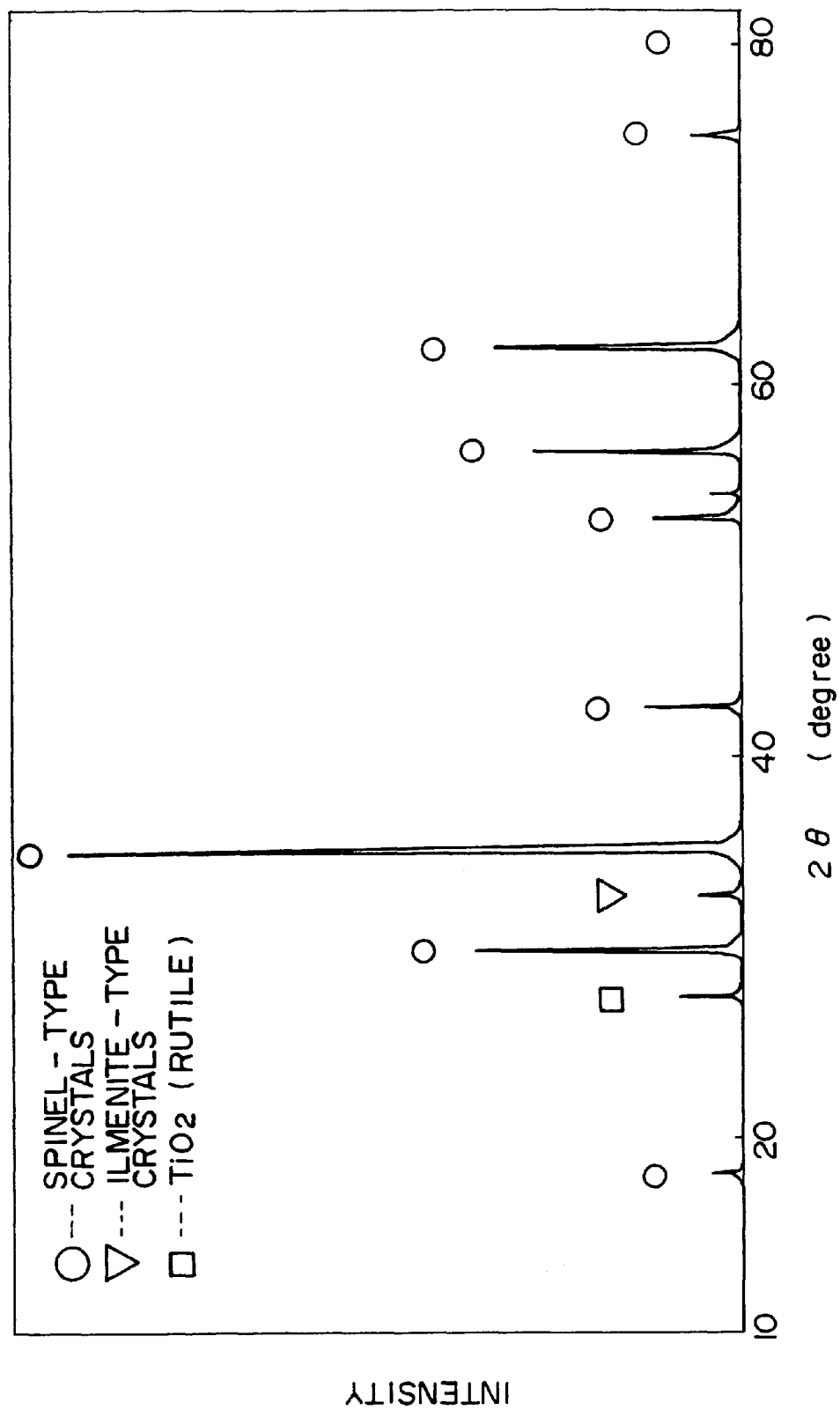
FIG. 12 is an X-ray diffraction chart of a sample No. 2-5 of Example 4.

The obtained ceramics were measured for their dielectric constants and dielectric loss tangents in the same manner as in Example 1, and the phases formed in the ceramics were identified by the X-ray diffraction. The results were as shown in Table 5. FIG. 12 is an X-ray diffraction chart of a ceramics No. 2-5.

TABLE 5

(x = 0, y = 0)

| Sample No. | a/b | Blended amount (wt %) | Amount of $B_2O_3$ (wt %) | Firing condition Temp. (°C.) | Time (hr) | Dielectric constant εr | Dielectric loss tangent tanδ ×10⁻⁴ | Phases (note 1) |
|---|---|---|---|---|---|---|---|---|
| *2-1 | 5.0 | 99.9 | 0.1 | 1000 | 1 | could not be measured | | Z>SP>G |
| 2-2 | 3.3 | 99.7 | 0.3 | 950 | 1 | 15 | 7 | SP>>Z>>G |
| 2-3 | 1.67 | 99.7 | 0.3 | 900 | 5 | 15 | 8 | SP>>Z>>G |
| 2-4 | 1.43 | 99.7 | 0.3 | 950 | 1 | 17 | 7 | SP>>Z>>G |
| 2-5 | 1.25 | 99.7 | 0.3 | 950 | 1 | 19 | 6 | SP>>T>I>>G |
| 2-6 | 0.67 | 99.5 | 0.5 | 985 | 1 | 25 | 7 | SP>T>>G |
| 2-7 | 0.4 | 99.5 | 0.5 | 1000 | 1 | 58 | 10 | SP>T>>G |
| 2-8 | 0.2 | 99.0 | 1.0 | 1000 | 1 | 72 | 11 | T>SP>>G |
| 2-9 | 0.14 | 95.0 | 5.0 | 1000 | 2 | 87 | 15 | T>SP>>G |
| *2-10 | 0.1 | 85.0 | 15.0 | 1000 | 1 | could not be measured | | T>>SP>G |
| *2-11 | 1.43 | 100 | 0 | 1300 | 1 | 20 | 5 | SP>>Z>>>G |
| *2-12 | 1.43 | 99.995 | 0.005 | 1000 | 1 | could not be measured | | SP>>Z>>>G |
| 2-13 | 1.43 | 99.99 | 0.05 | 1000 | 1 | 18 | 7 | SP>>Z>>G |
| 2-14 | 1.43 | 99.5 | 0.5 | 950 | 1 | 18 | 9 | SP>>Z>>G |
| 2-15 | 1.43 | 99.0 | 1.0 | 900 | 1 | 17 | 10 | SP>>Z>>G |
| 2-16 | 1.43 | 97.0 | 3.0 | 900 | 1 | 17 | 12 | SP>>Z>>G |
| 2-17 | 1.43 | 95.0 | 5.0 | 875 | 1 | 16 | 12 | SP>>Z>>G |
| 2-18 | 1.43 | 92.0 | 8.0 | 875 | 1 | 16 | 13 | SP>>Z>>G |
| 2-19 | 1.43 | 90.0 | 10.0 | 850 | 1 | 15 | 14 | SP>>Z>>G |
| *2-20 | 1.43 | 85.0 | 18.0 | 850 | 1 | could not be measured | | SP>>Z>G |
| *2-21 | 0.2 | 99.995 | 0.005 | 1000 | 2 | could not be measured | | T>SP>>G |
| 2-22 | 0.2 | 99.99 | 0.05 | 1000 | 1 | 85 | 12 | T>SP>>G |
| 2-23 | 0.2 | 99.5 | 0.5 | 1000 | 1 | 80 | 11 | T>SP>>G |
| 2-24 | 0.2 | 97.0 | 3.0 | 925 | 1 | 67 | 13 | T>SP>>G |

TABLE 5-continued (x = 0, y = 0)

| Sample No. | a/b | Blended amount (wt %) | Amount of $B_2O_3$ (wt %) | Firing condition Temp. (°C.) | Time (hr) | Dielectric constant $\epsilon r$ | Dielectric loss tangent $\tan\delta \times 10^{-4}$ | Phases (note 1) |
|---|---|---|---|---|---|---|---|---|
| 2-25 | 0.2 | 95.0 | 5.0 | 900 | 1 | 60 | 14 | T>SP>>G |
| *2-26 | 0.2 | 85.0 | 17.0 | 885 | 1 | could not be measured | | T>SP>G |

Samples marked with * lie outside the scope of the invention.
Note 1)
SP: Spinel-type crystal phase
Z: ZnO crystal phase
I: Ilmenite-type crystal phase
G: amorphous phase
T: $TiO_2$ crystal phase As will be obvious from the results of Table 5, the ceramics of the invention in which the spinel-type crystal phase ($Zn_2TiO_4$) or the $TiO_2$ crystal phase has chiefly precipitated, exhibited excellent properties such as a dielectric constant of 15 to 90 and a dielectric loss tangent of not larger than $15 \times 10^{-4}$ at 60 GHz, and could be sintered at 800 to 1000° C. As a result of analyzing the crystalline grain boundary phase of the ceramic products of the invention by using an X-ray microanalyzer, Zn and B were detected from the grain boundary phase.

On the other hand, samples Nos. 2-11, 2-12 and 2-21 containing $B_2O_3$ in an amount of smaller than 0.01% by weight could not be obtained in a dense form unless the firing temperature was increased to 1300° C., and was not suited for the object of the present invention. On the other hand, samples Nos. 2-20 and 2-26 containing $B_2O_3$ in an amount in excess of 15% by weight contained the liquid phase in such a large amount that the dielectric loss tangent was great, and the dielectric properties at 60 GHz could not be evaluated.

In a sample No. 2-1 (a/b>3.5) containing Ti at a small ratio relative to Zn, the ZnO phase precipitated to an excess degree. Therefore, the dielectric loss tangent was so great that the dielectric properties could not be evaluated at 60 GHz. A sample No. 2-10 (a/b<0.14) containing Ti at a large ratio relative to Zn could not be obtained in a dense form unless the sintering temperature was increased to 1200° C., and was not suited for the object of the present invention.

Example 5

The glass powder (see Table 2) used in Example 2, a ZnO powder and a $TiO_2$ powder having an average diameter of not larger than 1 μm were mixed together in compliance with the compositions shown in Tables 6 and 7. By using these mixtures, green sheets were prepared in the same manner as in Example 4. Five green sheets were laminated one upon the other and were adhered together at a temperature of 50° C. under a pressure of 100 kg/cm². The binder was removed from the thus obtained laminates in a water vapor-containing nitrogen atmosphere at 700° C. The laminates were then fired in dry nitrogen under the conditions of Tables 6 and 7 to obtain ceramics for multi-layer substrates.

Figure 13:
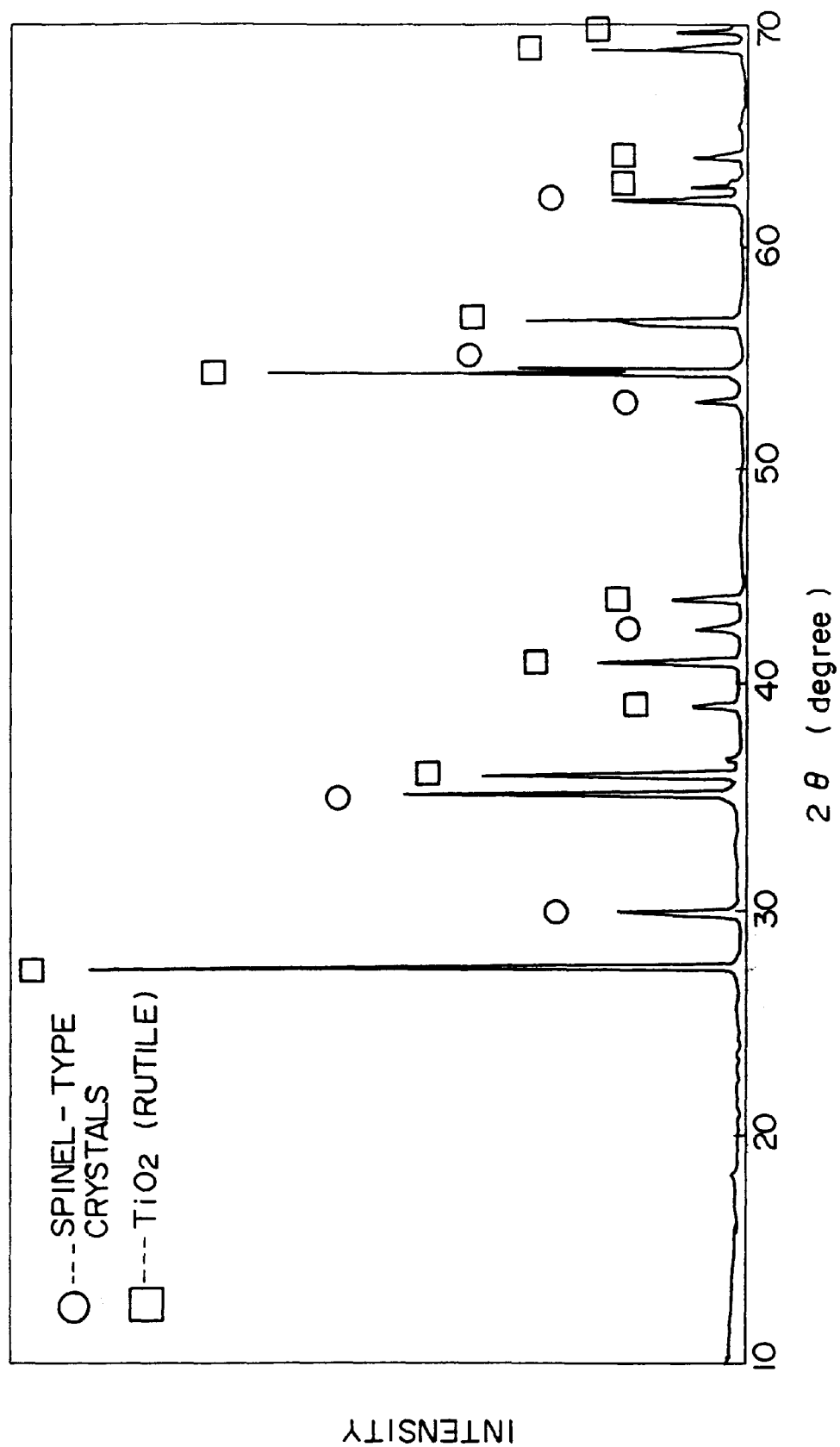
FIG. 13 is an X-ray diffraction chart of a sample No. 2-32 of Example 5.

The obtained sintered products were evaluated for their dielectric constants and dielectric loss tangents by the same method as that of Example 4. The results of measurement were as shown in Tables 6 and 7. Phases constituting the ceramics were identified from the measurement of X-ray diffraction. FIG. 13 is an X-ray diffraction chart of a sample No. 2-30.

TABLE 6

(x = y = 0)

| Sample No. | a/b | Blended amount (wt %) | Amount of glass Kind | (wt %) | Firing condition Temp. (°C.) | Time (hr) | Dielectric constant $\epsilon r$ | Dielectric loss tangent $\tan\delta \times 10^{-4}$ | Phases (note 1) |
|---|---|---|---|---|---|---|---|---|---|
| *2-27 | 5.0 | 99.5 | A | 0.5 | 950 | 1 | could not be measured | | Z>SP>>G |
| 2-28 | 2.5 | 99.5 | A | 0.5 | 950 | 1 | 15 | 10 | SP>>Z>>G |
| 2-29 | 1.67 | 99.5 | A | 0.5 | 1000 | 1 | 18.5 | 9 | SP>>Z>>G |
| 2-30 | 1.43 | 99.5 | A | 0.5 | 985 | 1 | 20 | 9 | SP>>Z>>G |
| 2-31 | 1.25 | 99.5 | A | 0.5 | 950 | 3 | 22 | 8 | SP>>T>I>>G |
| 2-32 | 0.77 | 99.0 | A | 1.0 | 1000 | 1 | 35 | 9 | SP>>T>>G |
| 2-33 | 0.4 | 99.0 | A | 1.0 | 1000 | 1 | 56 | 8 | SP>>T>>G |
| 2-34 | 0.2 | 98.0 | A | 2.0 | 1000 | 1 | 67 | 9 | T>SP>>G |
| 2-35 | 0.14 | 88.0 | A | 12.0 | 985 | 1 | 79 | 13 | T>SP>>G |
| *2-36 | 0.1 | 75.0 | A | 35.0 | 1000 | 1 | could not be measured | | T>>SP>G |
| *2-37 | 1.25 | 100 | A | 0 | 1300 | 1 | 20 | 5 | SP>>Z>>>G |
| *2-38 | 1.25 | 99.98 | A | 0.02 | 1000 | 1 | not sintered | | SP>>Z>>>G |
| 2-39 | 1.25 | 99.95 | A | 0.05 | 1000 | 1 | 18 | 8 | SP>>Z>>G |
| 2-40 | 1.25 | 99.0 | A | 1.0 | 975 | 1 | 18 | 10 | SP>>Z>>G |
| 2-41 | 1.25 | 95.0 | A | 5.0 | 950 | 1 | 17 | 11 | SP>>Z>>G |
| 2-42 | 1.25 | 90.0 | A | 10.0 | 900 | 1 | 17 | 13 | SP>>Z>>G |

TABLE 6-continued (x = y = 0)

| Sample No. | Blended amount a/b | Amount of glass Kind | (wt %) | Firing condition Temp. (°C.) | Time (hr) | Dielectric constant $\epsilon r$ | Dielectric loss tangent $\tan\delta \times 10^{-4}$ | Phases (note 1) |
|---|---|---|---|---|---|---|---|---|
| 2-43 | 1.25 | 80.0 A | 20.0 | 875 | 1 | 15 | 13 | SP>>Z>>G |
| *2-44 | 1.25 | 75.0 A | 35.0 | 850 | 1 | could not be measured | | SP>>Z>G |
| *2-45 | 0.2 | 99.98 A | 0.02 | 1000 | 1 | not sintered | | T>SP>>G |
| 2-46 | 0.2 | 99.5 A | 0.5 | 950 | 1 | 80 | 12 | T>SP>>G |
| 2-47 | 0.2 | 99.0 A | 1.0 | 925 | 1 | 75 | 12 | T>SP>>G |

Samples marked with * lie outside the scope of the invention.
Note 1)
SP: Spinel-type crystal phase
Z: ZnO crystal phase
I: Ilmenite-type crystal phase
G: amorphous phase
T: $TiO_2$ crystal phase

TABLE 7

(x = y = 0)

| Sample No. | Blended amount a/b | Amount of glass Kind | (wt %) | Firing condition Temp. (°C.) | Time (hr) | Dielectric constant $\epsilon r$ | Dielectric loss tangent $\tan\delta \times 10^{-4}$ | Phases (note 1) |
|---|---|---|---|---|---|---|---|---|
| 2-48 | 0.2 | 95.0 A | 5.0 | 900 | 1 | 65 | 13 | T>SP>>G |
| 2-49 | 0.2 | 85.0 A | 15.0 | 900 | 1 | 57 | 14 | T>SP>>G |
| *2-50 | 0.2 | 75.0 A | 35.0 | 875 | 1 | could not be measured | | T>SP>G |
| 2-51 | 2.0 | 99.0 B | 1.0 | 900 | 5 | 15 | 8 | SP>>Z>>G |
| 2-52 | 1.67 | 99.0 B | 1.0 | 900 | 3 | 17 | 9 | SP>>Z>>G |
| 2-53 | 1.43 | 99.0 B | 1.0 | 950 | 1 | 19 | 8 | SP>>I>>G |
| 2-54 | 1.25 | 99.0 B | 1.0 | 975 | 1 | 21 | 9 | SP>I>>G |
| 2-55 | 0.83 | 98.0 B | 2.0 | 950 | 3 | 33 | 10 | SP>T>>G |
| 2-56 | 0.5 | 97.0 B | 3.0 | 985 | 1 | 48 | 9 | SP>T>>G |
| 2-57 | 0.33 | 97.0 B | 3.0 | 1000 | 1 | 54 | 10 | SP>T>>G |
| 2-58 | 0.2 | 96.0 B | 4.0 | 1000 | 1 | 60 | 11 | SP>T>>G |
| *2-59 | 1.43 | 76.0 C | 24 | 1000 | 1 | not sintered | | SP>>Z>G |
| *2-60 | 1.43 | 80.0 D | 20 | 1000 | 1 | not sintered | | SP>>Z>G |
| 2-61 | 1.43 | 99.0 E | 1 | 975 | 1 | 18 | 14 | SP>>Z>>G |
| 2-62 | 1.43 | 99.7 F | 0.3 | 990 | 1 | 20 | 13 | SP>>Z>>G |
| 2-63 | 1.43 | 99.8 G | 0.2 | 975 | 1 | 21 | 13 | SP>>Z>>G |
| 2-64 | 1.43 | 99.6 H | 0.4 | 950 | 1 | 19 | 12 | SP>>Z>>G |
| 2-65 | 1.43 | 99.8 I | 0.2 | 975 | 1 | 20 | 10 | SP>>Z>>G |
| 2-66 | 1.43 | 99.8 J | 0.2 | 990 | 1 | 21 | 11 | SP>>Z>>G |
| 2-67 | 1.43 | 99.9 K | 0.1 | 1000 | 1 | 22 | 9 | SP>>Z>>G |
| 2-68 | 1.43 | 99.7 L | 0.3 | 950 | 1 | 18 | 12 | SP>>Z>>G |

Samples marked with * lie outside the scope of the invention.
Note 1)
SP: Spinel-type crystal phase
Z: ZnO crystal phase
I: Ilmenite-type crystal phase
G: amorphous phase
T: $TiO_2$ crystal phase As will be obvious from the results of Tables 6 and 7, the ceramics of the invention in which the spinel-type crystal phase ($Zn_2TiO_4$) or the $TiO_2$ crystal phase has chiefly precipitated, exhibited excellent properties such as a dielectric constant of 15 to 80 and a dielectric loss tangent of not larger than $15\times10^{-4}$ at 60 GHz, and could be sintered at 800 to 1000° C. As a result of analyzing the crystalline grain boundary phase of the ceramic products of the invention by using an X-ray microanalyzer, Zn and B were detected from the grain boundary phase.

On the other hand, samples Nos. 2-37, 2-28 and 2-45 containing the glass in an amount of smaller than 0.05% by weight could not be obtained in a dense form unless the firing temperature was increased to 1300° C., and was not suited for the object of the present invention. On the other hand, samples Nos. 2-35, 2-44 and 2-50 containing the glass in an amount in excess of 30% by weight contained the liquid phase in such a large amount that the dielectric loss tangent was great, and the dielectric properties at 60 GHz could not be evaluated.

In a sample No. 2-27 (a/b>3.5) containing Ti at a small ratio relative to Zn, the ZnO phase precipitated to an excess degree. Therefore, the dielectric loss tangent was so great that the dielectric properties could not be evaluated at 60 GHz. A sample No. 2-36 (a/b<0.14) containing Ti at a large ratio relative to Zn could not be obtained in a dense form unless the sintering temperature was increased to 1200° C., and was not suited for the object of the present invention.

Example 6

By using various ceramics, cylindrical samples (a) were prepared in a size of a diameter of 1 to 30 mm and a thickness of 2 to 15 mm. The ceramics No. 2-5 of Example 4, the ceramics No. 2-34 of Example 5, and, as Comparative Examples, a cordierite-type glass ceramics (75% by weight of borosilicate glass and 25% by weight of $Al_2O_3$) which is a general-purpose product and alumina ceramics (95% by weight of $Al_2O_3$ and 5% by weight of CaO, MgO) for general use, were measured for their dielectric constants and dielectric loss tangents by the dielectric cylindrical resonator method at high frequencies of 1 GHz, 10 GHz, 20 GHz, 30 GHz and 60 GHz and in the microwave and millimeter wave regions.

As a result, the cordierite-type glass ceramics which is a general-purpose product exhibited a dielectric constant of as considerably low as 5, and the low-purity alumina for general use exhibited a dielectric constant of as low as 9. On the other hand, the ceramic products of the present invention exhibited dielectric constants of as high as 19 and 67. The glass ceramics which is a general-purpose product exhibits a small dielectric loss tangent in a low-frequency region but exhibits deteriorated properties in a high-frequency region and exhibits a dielectric loss tangent of not smaller than $30 \times 10^{-4}$ at a frequency of not lower than 40 GHz. The alumina ceramics for general use, too, exhibited a dielectric loss tangent of as large as $30 \times 10^{-4}$ at 50 GHz. On the other hand, the products of the present invention exhibited a dielectric loss tangent of as small as $15 \times 10^{-4}$ or less in a high-frequency region of 60 GHz.

Example 7

$Zn_2SiO_4$, ZnO, $SiO_2$ and $B_2O_3$ powders having an average particle diameter of not larger than 1 μm were mixed together in compliance with the compositions shown in Table 1. To the mixtures were added an organic binder, a plasticizer and toluene, and green sheets of a thickness of 300 μm were prepared by the doctor blade method. Five green sheets were laminated one upon the other, and were adhered together at a temperature of 50° C. under a pressure of 100 kg/cm². The binder was removed from the thus obtained laminates in a water vapor-containing nitrogen atmosphere at 500 to 700° C. The laminates were then fired in dry nitrogen under the conditions of Table 8 to obtain ceramics for multi-layer substrates.

Figure 14:
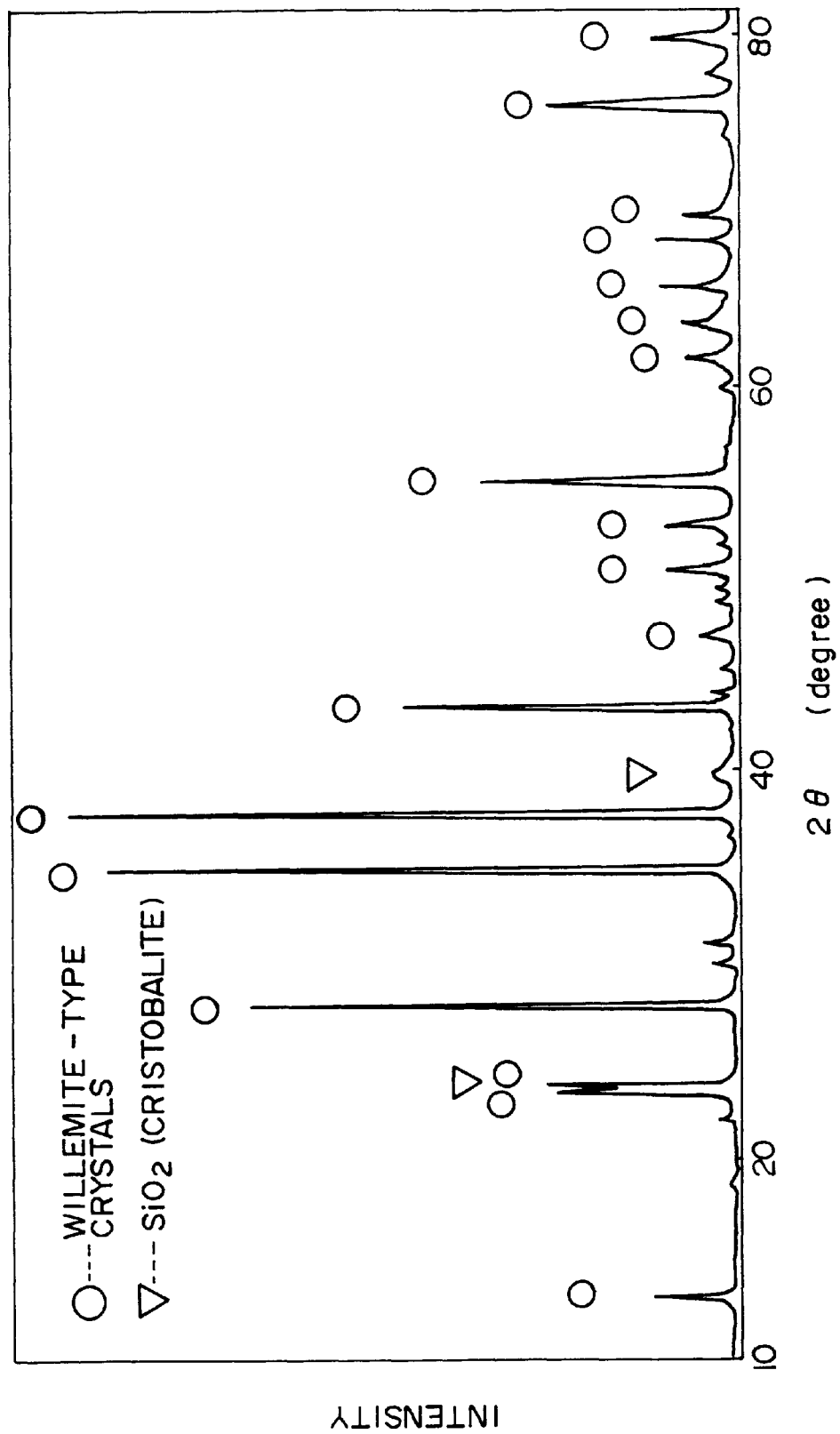
FIG. 14 is an X-ray diffraction chart of a sample No. 3-4 of Example 7.

The obtained ceramics were measured for their dielectric constants and dielectric loss tangents in the same manner as in Example 1, and the phases formed in the ceramics were identified by the X-ray diffraction. The results were as shown in Table 8. FIG. 14 is an X-ray diffraction chart of a ceramics No. 3-4.

As Comparative Examples, the sintered products were prepared in the same manner by using $MgSiO_3$ and $CaSiO_3$ in place of $Zn_2SiO_4$ and $SiO_2$, and were evaluated (samples Nos. 3-9 and 3-10).

TABLE 8

(x = 0, y = 1)

| Sample No. | a/b | Blended amount (wt %) | Amount of $B_2O_3$ (wt %) | Firing condition Temp. (°C.) | Time (hr) | Dielectric constant εr | Dielectric loss tangent tanδ x10⁻⁴ | Phases (note 1) |
|---|---|---|---|---|---|---|---|---|
| *3-1 | 1.0 | 99.95 | 0.05 | 1400 | 3 | could not be measured | | Z2S>S>>G |
| 3-2 | 1.0 | 99.8 | 0.2 | 1000 | 5 | 5.8 | 8 | Z2S>S>>G |
| 3-3 | 1.0 | 99.0 | 1.0 | 1000 | 1 | 5.5 | 6 | Z2S>S>>G |
| 3-4 | 1.0 | 98.0 | 2.0 | 985 | 1 | 5.3 | 8 | Z2S>S>>G |
| 3-5 | 1.0 | 95.0 | 5.0 | 950 | 1 | 5.2 | 7 | Z2S>S>>G |
| 3-6 | 1.0 | 90.0 | 10.0 | 900 | 1 | 5.5 | 10 | Z2S>S>>G |
| 3-7 | 1.0 | 86.0 | 14.0 | 900 | 1 | 5.4 | 11 | Z2S>S>>G |
| *3-8 | 1.0 | 80.0 | 20.0 | 850 | 1 | 5.4 | 170 | Z2S>S>G |
| *3-9 | $MgSiO_3$ | 80.0 | 20.0 | 1000 | 1 | 6.5 | 150 | MS>M2S>G |
| *3-10 | $CaSiO_3$ | 80.0 | 20.0 | 1000 | 1 | 6.8 | 200 | CS>C2S>G |
| *3-11 | 10.0 | 99.0 | 1.0 | 950 | 1 | could not be measured | | Z>Z2S>>G |
| 3-12 | 3.3 | 98.0 | 2.0 | 925 | 1 | 6.0 | 15 | Z2S>Z>>G |
| 3-13 | 2.0 | 98.0 | 2.0 | 925 | 1 | 5.9 | 13 | Z2S>>Z>G |
| 3-14 | 0.67 | 95.0 | 5.0 | 970 | 1 | 5.4 | 8 | Z2S>>G |
| 3-15 | 0.5 | 95.0 | 5.0 | 950 | 1 | 5.0 | 7 | Z2S>S>>G |
| 3-16 | 0.33 | 95.0 | 5.0 | 985 | 1 | 4.9 | 6 | S>Z2S>>G |
| 3-17 | 0.2 | 90.0 | 10.0 | 950 | 1 | 4.7 | 9 | S>Z2S>>G |
| *3-18 | 0.13 | 75.0 | 25.0 | 1000 | 1 | 4.8 | 260 | S>Z2S>G |

Samples marked with * lie outside the scope of the invention.
Note 1)
Z2S: $Zn_2SiO_4$,
S: $SiO_2$,
Z: ZnO,
MS: $MgSiO_3$,
CS: $CaSiO_3$,
M2S: $Mg_2SiO_4$,
C2S: $Ca_2SiO_4$,
G: glass As will be obvious from the results of Table 8, the ceramics of the invention in which the willemite-type crystal phase ($Zn_2SiO_4$) or the SiO2 crystal phase has chiefly precipitated, exhibited excellent properties such as a dielectric constant of not larger than 6 and a dielectric loss tangent of not larger than $15 \times 10^{-4}$ at 60 GHz.

On the other hand, a sample No. 3-1 containing $B_2O_3$ in an amount of smaller than 0.5% by weight could not be obtained in a dense form unless the firing temperature was increased to 1400° C., and was not suited for the object of the present invention. On the other hand, a sample No. 38 containing $B_2O_3$ in an amount in excess of 15% by weight contained the liquid phase in a large amount, and was fired at a low temperature. Therefore, the dielectric loss was so large that the dielectric properties at 60 GHz could not be evaluated.

As a result of analyzing the liquid phases in the ceramic products of the present invention by using an X-ray microanalizer, there were detected Zn, B and small a amount of Si from the liquid phases.

In a sample No. 3-11 (a/b>3.5) containing Si at a small ratio relative to Zn, the ZnO phase precipitated to an excess degree. Therefore, the dielectric loss tangent was so great that the dielectric properties could not be evaluated at 60 GHz.

In a sample No. 1-18 (a/b<0.14) containing Si at a large ratio relative to Zn, the $SiO_2$ precipitated to an excess degree and the amount of Zn was not sufficient. Therefore, the liquid phase could not be formed with B in $B_2O_3$, and the ceramics could not be obtained in a dense form unless $B_2O_3$ was added in an amount of not smaller than 15% by weight. The system to which $B_2O_3$ was added in an amount of not smaller than 15% by weight exhibited deteriorated dielectric properties.

In samples Nos. 3-9 and 3-10 using $MgSiO_3$ and $CaSiO_3$ as Comparative Examples, the ceramics could not be obtained in a dense form unless $B_2O_3$ was added in an amount of not smaller than 15% by weight. Therefore, dielectric properties were not obtained to a sufficient degree, and the ceramics were not suited for the object of the present invention.

Example 8

The glass powder (see Table 2) used in Example 2, a $Zn_2SiO_4$ powder having an average particle diameter of not larger than 1 μm and an $SiO_2$ powder having an average diameter of not larger than 1 μm were mixed together in compliance with the compositions shown in Table 9. To the mixtures were added an organic binder, a plasticizer and toluene, and green sheets having a thickness of 300 μm were prepared by the doctor blade method. Five green sheets were laminated one upon the other and were adhered together at a temperature of 50° C. under a pressure of 100 kg/cm². The binder was removed from the thus obtained laminates in a water vapor-containing nitrogen atmosphere at 700° C. The laminates were then fired in dry nitrogen under the conditions of Table 9 to obtain ceramics for multi-layer substrates.

Figure 15:
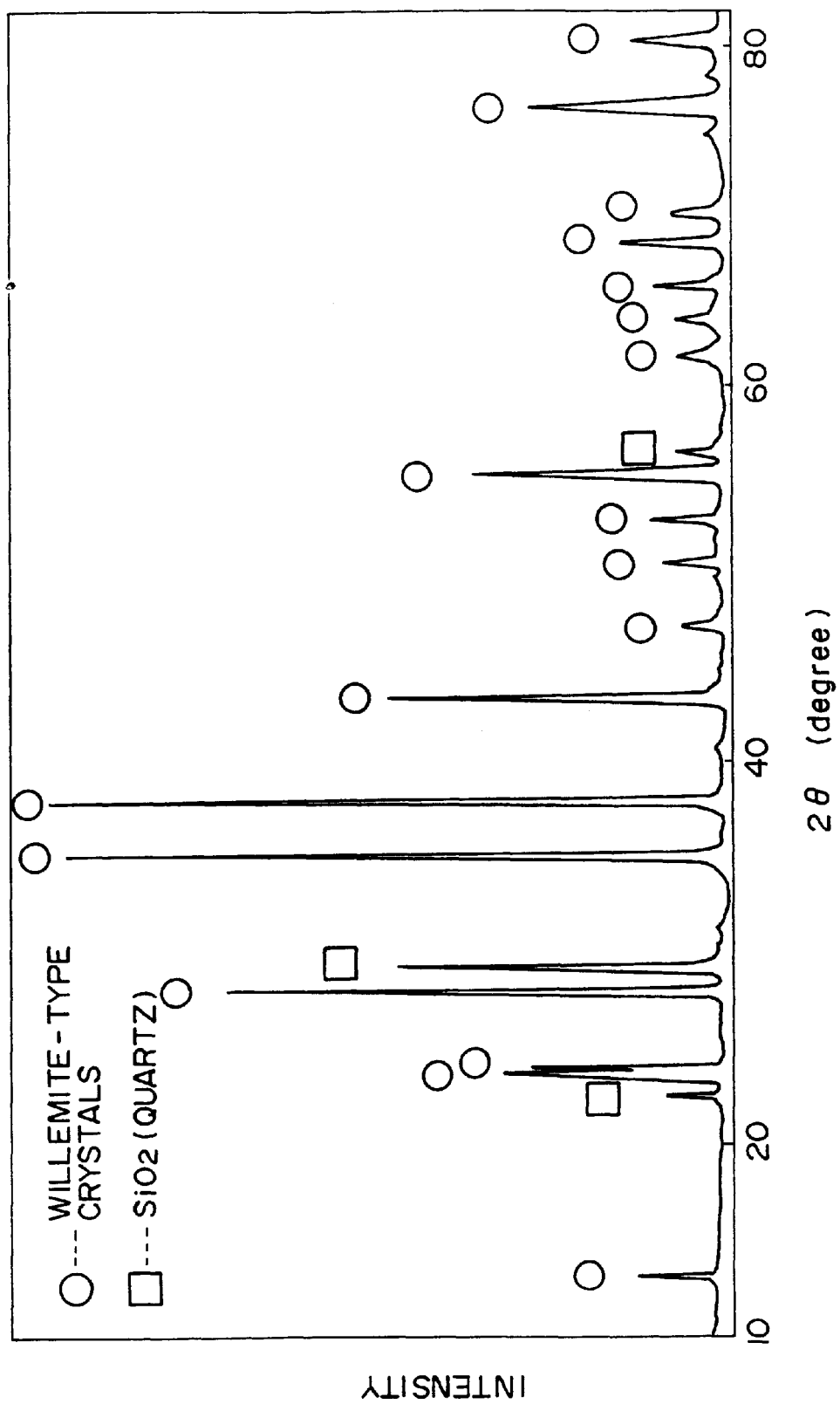
FIG. 15 is an X-ray diffraction chart of a sample No. 3-43 of Example 8.

The obtained sintered product were evaluated for their dielectric constants, dielectric loss tangents and crystal phases by the same method as that of Example 1. The results of measurement were as shown in Table 9. Phases constituting the ceramics were identified from the measurement of X-ray diffraction. FIG. 15 is an X-ray diffraction chart of a sample No. 3-43.

As Comparative Examples, sintered products were prepared by using $MgSiO_3$ and $CaSiO_3$ instead of $Zn_2SiO_4$ and $SiO_2$, and were evaluated (samples Nos. 3-38 and 3-39).

TABLE 9

(x = 0, y = 1)

| Sample No. | a/b | Blended amount (wt %) | Amount of glass Kind | (wt %) | Firing condition Temp. (°C.) | Time (hr) | Dielectric constant ∈r | Dielectric loss tangent tanδ ×10⁻⁴ | Phases (note 1) |
|---|---|---|---|---|---|---|---|---|---|
| *3-19 | 1.0 | 99.5 | A | 0.1 | 1400 | 5 | could not be measured | | Z2S>S>>G |
| 3-20 | 1.0 | 99.0 | A | 0.5 | 1000 | 5 | 5.7 | 9 | Z2S>S>>G |
| 3-21 | 1.0 | 99.0 | A | 1.0 | 1000 | 5 | 5.6 | 7 | Z22S>S>>G |
| 3-22 | 1.0 | 97.0 | A | 3.0 | 100 | 1 | 5.5 | 8 | Z2S>2>>G |
| 3-23 | 1.0 | 95.0 | A | 5.0 | 950 | 1 | 5.5 | 9 | Z2S>S>>G |
| 3-24 | 1.0 | 90.0 | A | 10.0 | 900 | 1 | 5.3 | 11 | Z2S>S>>G |
| 3-25 | 1.0 | 85.0 | A | 15.0 | 900 | 1 | 5.4 | 13 | Z2S>S>>G |
| 3-26 | 1.0 | 80.0 | A | 20.0 | 875 | 1 | 5.3 | 15 | Z2S>S>>G |
| *3-27 | 1.0 | 70.0 | A | 35.0 | 850 | 1 | 5.7 | 160 | Z2S>S>>G |
| 3-28 | 1.0 | 98.0 | B | 2.0 | 985 | 1 | 5.4 | 8 | Z2S>S>>G |
| 3-29 | 1.0 | 94.0 | B | 6.0 | 950 | 1 | 5.3 | 9 | Z2S>S>>G |
| 3-30 | 1.0 | 90.0 | B | 10.0 | 900 | 1 | 5.5 | 10 | Z2S>S>>G |
| 3-31 | 1.0 | 86.0 | B | 14.0 | 885 | 1 | 5.3 | 12 | Z2S>S>>G |
| *3-32 | 1.0 | 97.0 | C | 3.0 | 1400 | 3 | not dense | | Z2S>S>>G |
| *3-33 | 1.0 | 93.0 | C | 7.0 | 1400 | 1 | not dense | | Z2S>S>>G |
| *3-34 | 1.0 | 90.0 | C | 10.0 | 1400 | 1 | not dense | | Z2S>S>>G |
| *3-35 | 1.0 | 82.0 | C | 18.0 | 1400 | 1 | not dense | | Z2S>S>>G |
| 3-36 | 1.0 | 95.0 | F | 5.0 | 975 | 1 | 5.0 | 9 | Z2S>S>>G |
| 3-37 | 1.0 | 90.0 | F | 10.0 | 950 | 1 | 5.1 | 11 | Z2S>S>>G |
| *3-38 | MgSiO₃ | 55.0 | A | 45.0 | 1000 | 1 | 6.6 | 140 | MS>M2S>G |
| *3-39 | CaSiO₃ | 60.0 | A | 40.0 | 1000 | 1 | 6.9 | 220 | CS>C2S>G |
| *3-40 | 10.0 | 99.0 | A | 1.0 | 950 | 1 | could not be measured | | Z2S>Z>>G |
| 3-41 | 3.3 | 99.0 | A | 1.0 | 950 | 1 | 5.8 | 10 | Z2S>Z>>G |
| 3-42 | 1.3 | 97.0 | A | 3.0 | 900 | 1 | 5.7 | 9 | Z2S>>G |
| 3-43 | 0.5 | 90.0 | A | 10.0 | 975 | 1 | 5.0 | 9 | Z2S>S>>G |
| 3-44 | 0.33 | 90.0 | A | 10.0 | 985 | 1 | 4.9 | 8 | S>Z2S>>G |
| 3-45 | 0.2 | 85.0 | A | 15.0 | 1000 | 1 | 4.8 | 10 | S>Z2S>>G |

TABLE 9-continued (x = 0, y = 1)

| Sample No. | Blended amount a/b | Amount of glass Kind | Amount of glass (wt %) | Firing condition Temp. (°C.) | Firing condition Time (hr) | Dielectric constant εr | Dielectric loss tangent tanδ ×10⁻⁴ | Phases (note 1) |
|---|---|---|---|---|---|---|---|---|
| 3-46 | 0.17 | 82.0 A | 18.0 | 985 | 1 | 4.6 | 14 | S>Z2S>>G |
| *3-47 | 0.13 | 70.0 A | 32.0 | 1000 | 1 | 4.8 | 210 | S>Z2S>>G |

Samples marked with * lie outside the scope of the invention.
Note 1)
Z2S: $Zn_2SiO_4$,
S: $SiO_2$,
Z: ZnO,
MS: $MgSiO_3$,
CS: $CaSiO_3$,
M2S: $Mg_2SiO_4$,
C2S: $Ca_2SiO_4$,
G: glass As will be obvious from the results of Table 9, the ceramics of the invention in which the willemite-type crystal phase ($Zn_2SiO_4$) or the $SiO_2$ crystal phase has chiefly precipitated, exhibited excellent properties such as a dielectric constant of not larger than 6 and a dielectric loss tangent of not larger than $15\times10^{-4}$ at 60 GHz.

On the other hand, a sample No. 3-19 containing smaller than 0.5% by weight of a glass that contains at least $SiO_2$ and $B_2O_3$ could not be obtained in a dense form unless the firing temperature was increased to 1400° C., and was not suited for the object of the present invention. On the other hand, a sample No. 3-27 containing larger than 20% by weight of the glass containing at least $SiO_2$ and $B_2O_3$ contained a liquid phase in a large amount, and was fired at a low temperature. Therefore, the dielectric loss was large and the dielectric properties at 60 GHz could not be evaluated.

As a result of analyzing the liquid phases of the ceramic products of the present invention by using an X-ray microanalyzer, there were detected Zn, B and a small amount of Si from the liquid phases.

In a sample No. 3-40 (a/b>3.5) containing Si at a small ratio relative to Zn, the ZnO phase precipitated to an excess degree. Therefore, the dielectric loss tangent was so great that the dielectric properties could not be evaluated at 60 GHz. In a sample No. 3-47 (a/b<0.14) containing Si at a large ratio relative to Zn, the $SiO_2$ phase precipitated to an excess degree and the amount of Zn was not sufficient. Therefore, the liquid phase could not be formed with B in the glass, and the ceramics could not be obtained in a dense form unless the glass was added in an amount of not smaller than 30% by weight. A system to which the glass was added in an amount in excess of 30% by weight exhibited deteriorated dielectric properties.

Samples Nos. 3-38 and 3-39 using $MgSiO_3$ and CaSiO3 as Comparative Examples could not be densely formed unless the glass was added in an amount of not smaller than 30% by weight. Therefore, dielectric properties were not exhibited to a sufficient degree, and the ceramics were not suited for the object of the present invention.

Example 9

Cylindrical samples having a diameter of 1 to 30 mm and a thickness of 2 to 15 mm were prepaied by using ceramics No. 3-4 of Example 7 and ceramics No. 3-43 of Example 8. As Comparative Examples, furthermore, samples were prepared in the same manner by using cordierite-type glass ceramics (75% by weight of borosilicate glass and 25% by weight of $Al_2O_3$) which is a general-purpose product, and low-purity alumina (95% by weight of $Al_2O_3$ and 5% by weight of CaO and MgO) for general use. The samples were measured for their dielectric constants and dielectric loss tangents by the dielectric cylindrical resonator method at high frequencies of 1 GHz, 10 GHz, 20 GHz, 30 GHz and 60 GHz and in the microwave and millimeter wave regions. The cordierite-type glass ceramics which is a general-purpose product exhibited a dielectric constant of as low as 5, and the low-purity alumina for general use exhibited a dielectric constant of as low as 9. On the other hand, the ceramic products of the present invention exhibited dielectric constants of as low as 5. The glass ceramics which is a general-purpose product exhibits a dielectric loss tangent of as low as $7\times10^{-4}$ in a low-frequency region but exhibits deteriorated properties in a high-frequency region and exhibits a dielectric loss tangent of not smaller than $30\times10^{-4}$ at a frequency of not lower than 40 GHz. The low-purity alumina for general use, too, exhibited a dielectric loss tangent of as large as $30\times10^{-4}$ at 50 GHz. On the other hand, the products of the present invention exhibited a dielectric loss tangent of as small as $15\times10^{-4}$ or less in a high-frequency region of 60 GHz.

Example 10

A $B_2O_3$ powder having an average particle diameter of not larger than 1 μm, and $Zn_2TiO_4$, MgTiO3, $Zn_2SiO_4$, $TiO_2$ and $SiO_2$ powders having an average particle diameter of not larger than 1 μm were mixed together in compliance with the compositions shown in Tables 10 and 11. To the mixtures were added an organic binder, a plasticizer and toluene, and gee sheets of a thickness of 300 μm were prepared by the doctor blade method. Five green sheets were laminated one upon the other, and were adhered together at a temperature of 50° C. under a pressure of 100 kg/cm². The binder was removed from the thus obtained laminates of some of the compositions in a water vapor-containing nitrogen atmosphere at 500 to 700° C. The laminates were then fired in dry nitrogen under the conditions of Tables 10 and 11 to obtain ceramics for multi-layer substrates. From the laminates of other compositions was also removed the binder in the open air at 500 to 700° C. The laminates were then fired in the open air under the conditions of FIGS. 10 and 11 to obtain ceramics for multi-layer substrates.

Figure 16:
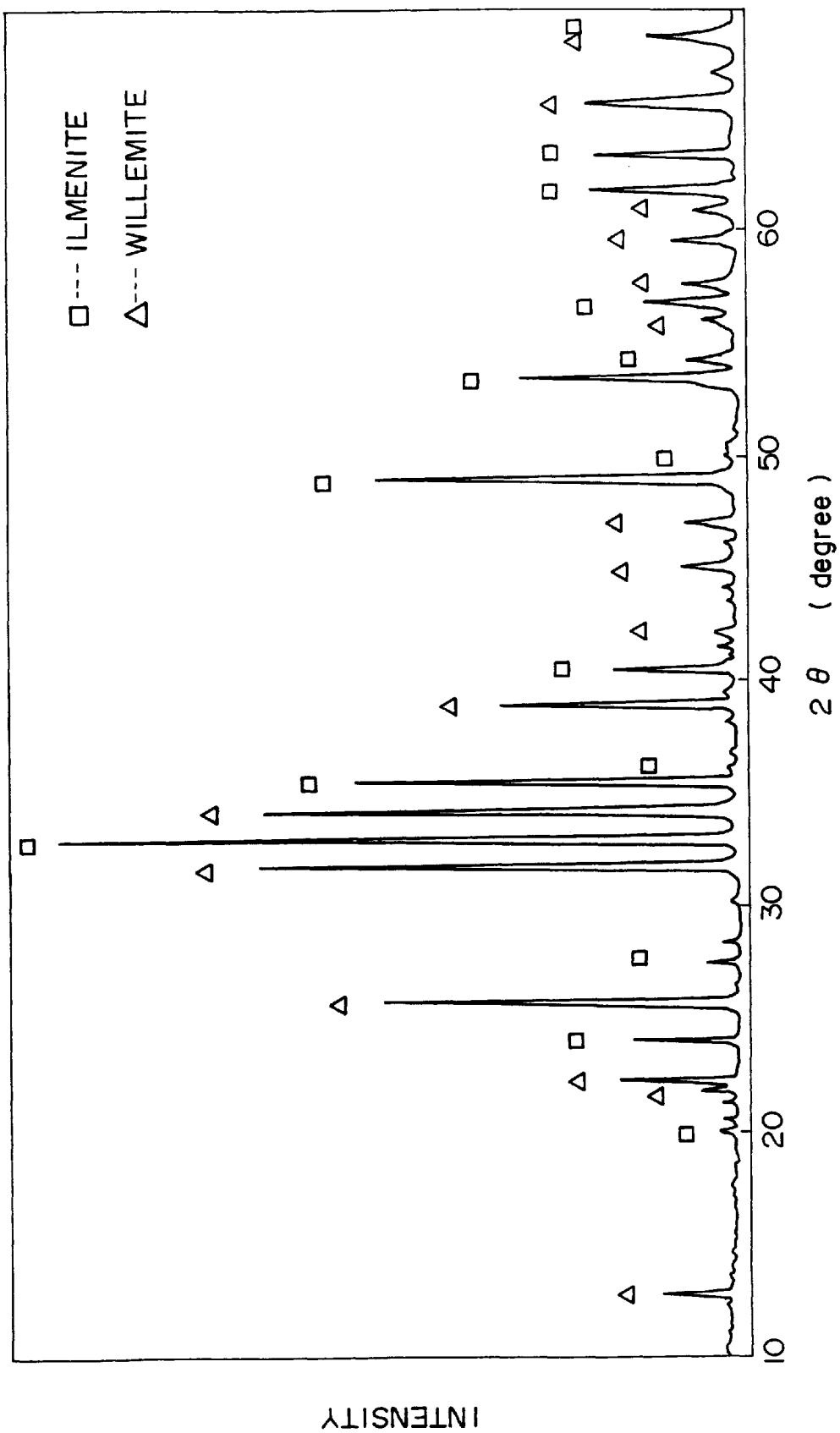
FIG. 16 is an X-ray diffraction chart of a sample No. 4-6 of Example 10.
Figure 17:
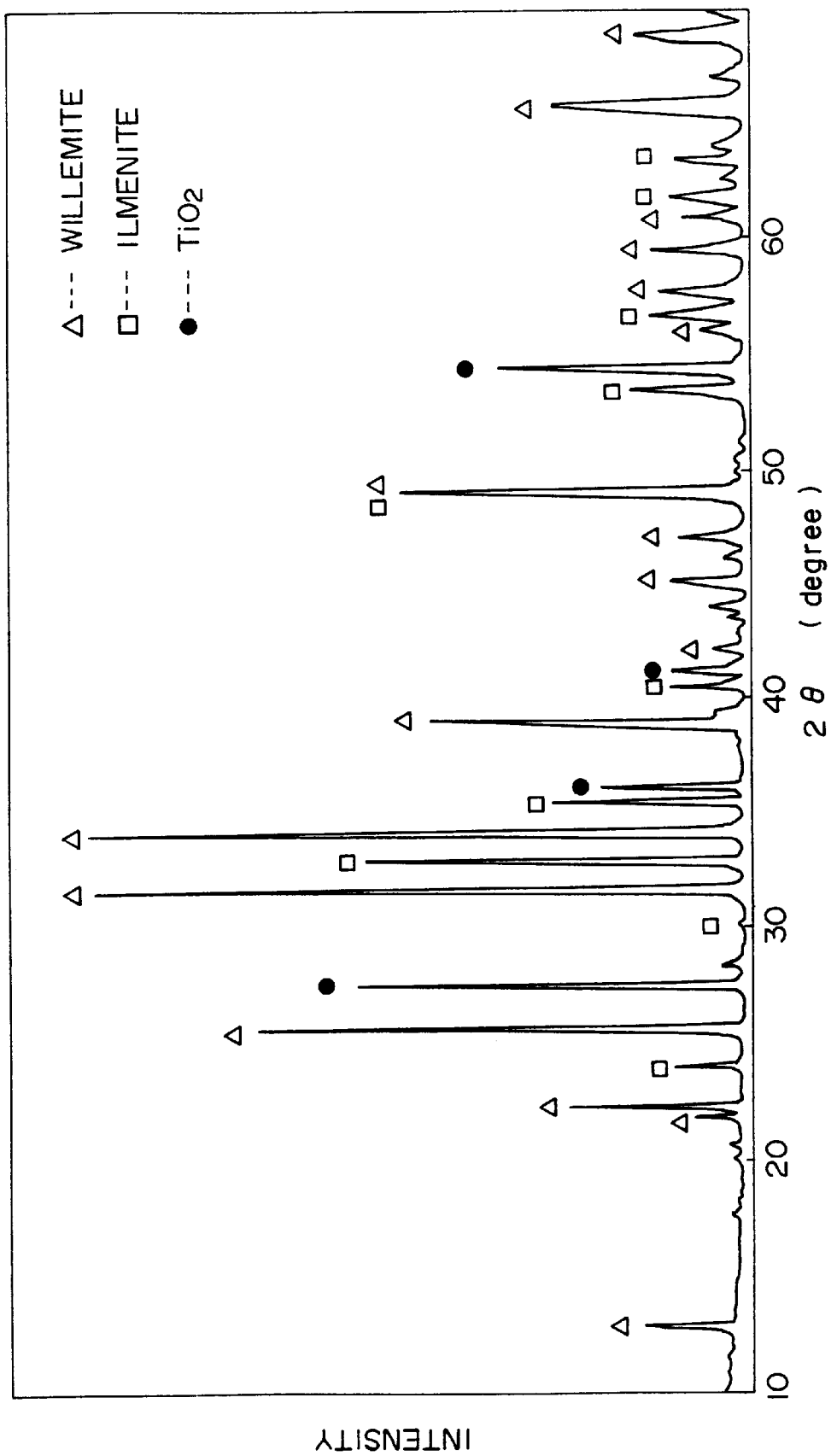
FIG. 17 is an X-ray diffraction chart of a sample No. 4-21 of Example 10.

The obtained ceramics were measured for their dielectric constants and dielectric loss tangents in the same manner as in Example 1, and the phases formed in the ceramics were identified by the X-ray diffraction. The results were as shown in Tables 10 and 11. FIGS. 16 and 17 are X-ray diffraction charts of ceramics Nos. 4-6 and 4-21.

As Comparative Examples, the sintered products were prepared in the same manner by using $BaTiO_3$ and $Al_6Si_2O_{13}$ (mullite) in place of $Zn_2TiO_4$, $MgTiO_3$ and $Zn_2SiO_4$, and were evaluated (samples Nos. 4-36 and 4-37).

TABLE 10

$(0 < x \leq 0.75, 0 < y < 1.0)$

| Sample No. | x | y | a/b | Blended amount (wt %) | Amount of $B_2O_3$ (wt %) | Firing condition Temp. (°C.) | Time (hr) | Dielectric constant $\epsilon r$ | Dielectric loss tangent tan$\delta$ ×10$^{-4}$ | Phases (note 1) |
|---|---|---|---|---|---|---|---|---|---|---|
| *4-1 | 0.01 | 0.9 | 1.9 | 99.0 | 1.0 | 950 | 1 | 5.5 | 7 | ZS>I>>G |
| 4-2 | 0.03 | 0.8 | 1.8 | 98.0 | 2.0 | 900 | 1 | 6.3 | 6 | ZS>I>>G |
| 4-3 | 0.04 | 0.7 | 1.7 | 98.0 | 2.0 | 900 | 3 | 9.1 | 5 | ZS>I>>G |
| 4-4 | 0.06 | 0.6 | 1.6 | 97.0 | 3.0 | 925 | 1 | 11.2 | 7 | I>ZS>>G |
| 4-5 | 0.08 | 0.5 | 1.5 | 97.0 | 3.0 | 950 | 1 | 13.3 | 8 | I>ZS>>G |
| 4-6 | 0.11 | 0.4 | 1.4 | 96.0 | 4.0 | 950 | 1 | 16.2 | 6 | I>ZS>>G |
| 4-7 | 0.14 | 0.3 | 1.3 | 96.0 | 4.0 | 925 | 1 | 16.1 | 5 | J>ZS>>G |
| 4-8 | 0.17 | 0.2 | 1.2 | 95.0 | 5.0 | 900 | 2 | 16.9 | 7 | I>ZS>>G |
| 4-9 | 0.21 | 0.1 | 1.1 | 95.0 | 5.0 | 950 | 1 | 20.1 | 8 | I>ZS>>G |
| *4-10 | 0.10 | 0.1 | 4.0 | 99.0 | 1.0 | 925 | 1 | could not be measured | | ZN>SP>ZS>>G |
| 4-11 | 0.10 | 0.1 | 3.5 | 98.5 | 1.5 | 975 | 2 | 17.2 | 17 | SP>ZS>ZN>>G |
| 4-12 | 0.10 | 0.1 | 2.5 | 98.5 | 1.5 | 950 | 1 | 16.3 | 13 | SP>ZS>ZN>>G |
| 4-13 | 0.10 | 0.1 | 0.2 | 96.0 | 4.0 | 975 | 1 | 70.1 | 14 | SP>T>ZS>>G |
| *4-14 | 0.10 | 0.1 | 0.1 | 75.0 | 25.0 | 900 | 1 | could not be measured | | T>S,G |
| 4-15 | 0.02 | 0.9 | 1.0 | 98.5 | 1.5 | 950 | 1 | 6.6 | 6 | ZS>S>T>SP>G |
| 4-16 | 0.04 | 0.8 | 1.0 | 99.0 | 1.0 | 925 | 2 | 8.2 | 9 | ZS>S>T>>SP>G |
| 4-17 | 0.05 | 0.8 | 1.0 | 98.5 | 1.5 | 950 | 1 | 8.0 | 9 | ZS>I>T>>SP>G |
| 4-18 | 0.08 | 0.6 | 1.0 | 99.0 | 1.0 | 1000 | 1 | 12.3 | 10 | ZS>I>T>>SP>G |

Samples marked with * lie outside the scope of the invention.
Note 1)
ZS: willemite,
I: ilmenite,
S: $SiO_2$,
T: $TiO_2$,
SP: spinel
MS: $MgSiO_3$,
BT: $BaTiO_3$,
G: glass,
ZN: ZnO

TABLE 11

$(0 < x \leq 0.75, 0 < y < 1.0)$

| Sample No. | x | y | a/b | Blended amount (wt %) | Amount of $B_2O_3$ (wt %) | Firing condition Temp. (°C.) | Time (hr) | Dielectric constant $\epsilon r$ | Dielectric loss tangent tan$\delta$ ×10$^{-4}$ | Phases (note 1) |
|---|---|---|---|---|---|---|---|---|---|---|
| 4-19 | 0.10 | 0.5 | 1.0 | 99.0 | 1.0 | 1000 | 0.5 | 16.4 | 11 | ZS>J>T>>SP>G |
| 4-20 | 0.12 | 0.4 | 1.0 | 99.2 | 0.8 | 950 | 1 | 18.3 | 8 | ZS>I>T>>SP>G |
| 4-21 | 0.13 | 0.5 | 1.0 | 99.3 | 0.7 | 950 | 1 | 16.5 | 13 | ZS>T>T>>SP>G |
| 4-22 | 0.14 | 0.3 | 1.0 | 99.5 | 0.5 | 950 | 1 | 19.2 | 6 | I>ZS>T>>SP>G |
| 4-23 | 0.15 | 0.4 | 1.0 | 99.5 | o.5 | 1000 | 1 | 17.6 | 6 | I>ZS>T>>SP>G |
| 4-24 | 0.15 | 0.8 | 1.0 | 99.1 | 0.9 | 1000 | 1 | 8.0 | 7 | ZS>SP>>G |
| 4-25 | 0.45 | 0.4 | 1.0 | 99.3 | 0.7 | 975 | 2 | 16.7 | 8 | SP>T>ZS>>G |
| 4-26 | 0.53 | 0.3 | 1.0 | 99.2 | 0.8 | 975 | 1 | 18.5 | 10 | SP>T>ZS>>G |
| *4-27 | 0.90 | 0.50 | 1.0 | 70.0 | 30.0 | 900 | 1 | 7.0 | 300 | MS>SP,ZS,G |
| 4-28 | 0.10 | 0.05 | 0.95 | 98.0 | 2.0 | 950 | 1 | 19.0 | 7 | SP>I>ZS>>G |
| 4-29 | 0.20 | 0.09 | 0.91 | 97.0 | 3.0 | 975 | 1 | 16.5 | 5 | I>ZS>>G |
| 4-30 | 0.30 | 0.13 | 0.8 | 96.0 | 4.0 | 975 | 1 | 14.1 | 6 | I>ZS>>G |
| *4-31 | 0.10 | 0.50 | 0.2 | 99.99 | 0.01 | 1300 | 10 | could not be measured | | SP>ZS>T>>G |
| 4-32 | 0.10 | 0.50 | 0.2 | 93.0 | 7.0 | 1000 | 1 | 40.2 | 9 | SP>ZS>T>>G |
| 4-33 | 0.10 | 0.50 | 0.2 | 90.0 | 10.0 | 950 | 1 | 31.1 | 14 | SP>ZS>T>G |
| 4-34 | 0.10 | 0.50 | 0.2 | 85.0 | 15.0 | 900 | 1 | 26.0 | 17 | SP>ZS>T>G |
| *4-35 | 0.10 | 0.50 | 0.2 | 75.0 | 25.0 | 800 | 1 | could not be measured | | SP,ZS,G |

TABLE 11-continued ($0 < x \leq 0.75, 0 < y < 1.0$)

| Sample No. | x | y | a/b | Blended amount (wt %) | Amount of $B_2O_3$ (wt %) | Firing condition Temp. (°C.) | Time (hr) | Dielectric constant $\epsilon r$ | Dielectric loss tangent $\tan\delta \times 10^{-4}$ | Phases (note 1) |
|---|---|---|---|---|---|---|---|---|---|---|
| *4-36 | BaTiO₃ | | | 80.0 | 20.0 | 900 | 1 | could not be measured | | BT>G |
| *4-37 | mulite | | | 89.0 | 20.0 | 900 | 1 | could not be measured | | mulite>G |

Samples marked with * lie outside the scope of the invention.
Note 1)
ZS: willemite,
I: ilmenite,
S: $SiO_2$,
T: $TiO_2$,
SP: spinel
MS: $MgSiO_3$,
BT: $BaTiO_3$,
G: glass,
ZN: ZnO As will be obvious from the results of Tables 10 and 11, the ceramics of the invention in which the ilmenite-type crystal phase ($(Zn, Mg)TiO_3$) or willemite crystal phase ($(Zn, Mg)_2SiO_4$) or spinel crystal phase ($(Zn, Mg)_2TiO_4$) has chiefly precipitated, permitted the dielectric constant to be adjusted over a range of from 5 to 80, exhibited excellent properties such as a dielectric loss of not larger than $20\times10^{-4}$ at 60 GHz. As a result of analysis of crystalline grain boundary phases of ceramics of the present invention by using an X-ray microanalyzer, Zn and B were detected from the grain boundary phases.

On the other hand, a sample No. 4-31 containing $B_2O_3$ in an amount of smaller than 0.05% by weight could not be obtained in a dense form unless the firing temperature was increased to 1300° C., and was not suited for the object of the present invention. On the other hand, samples Nos. 4-14, 4-27 and 4-35 containing $B_2O_3$ in an amount in excess of 20% by weight contained the liquid phase in large amounts and the dielectric loss tangents were so large that the dielectric properties at 60 GHz could not be evaluated.

In a sample No. 4-10 (a/b>3.5) containing (Ti+Si) at a small ratio relative to (Zn+Mg), the ZnO phase precipitated to an excess degree. Therefore, the dielectric loss tangent was so great that the dielectric properties could not be evaluated at 60 GHz. In a sample No. 4-14 (a/b<0.14) containing (Ti+Si) at a large ratio relative to (Zn+Mg), the ceramics could not be obtained in a dense form unless $B_2O_3$ was added in an amount in excess of 20% by weight. When $B_2O_3$ was added in an amount of not smaller than 20% by weight, however, the amount of the liquid phase was too great resulting in an increase in the dielectric loss tangent of the ceramics.

In a sample No. 4-27 in which x>0.75, the amount of Zn was not enough, and the liquid phase was not formed with B in $B_2O_3$. Therefore, the ceramics could not be obtained in a dense form unless $B_2O_3$ was added in an amount of not smaller than 20% by weight, and poor dielectric properties were exhibited.

Samples Nos. 4-36 and 4-37 obtained by using $BaTiO_3$ and $Al_6Si_2O_{13}$ (mullite) as Comparative Examples, exhibited large dielectric loss tangents, and their properties could not be measured at 60 GHz.

Example 11

The glass powder (see Table 2) used in Example 2, and $Zn_2TiO_4$ and $MgTiO_3$ powders having an average diameter of not larger than 1 μm were mixed together in compliance with the compositions shown in Tables 12 and 13. Green sheets were prepared by using these mixtures in the same manner as in Example 9. Five green sheets were laminated one upon the other and were adhered together at a temperature of 50° C. under a pressure of 100 kg/cm². The binder was removed from the thus obtained laminates of some of the compositions in a water vapor-containing nitrogen atmosphere at 500 to 700° C. The laminates were then fired in dry nitrogen under the conditions of Tables 12 and 13 to obtain ceramics for multi-layer substrates. From the laminates of other compositions was also removed the binder in the open air at 500 to 700° C. The laminates were then fired in the open air under the conditions of Tables 4 and 5 to obtain ceramics for multi-layer substrates. The obtained ceramics were measured for their dielectric constants and dielectric losses in the same manner as in Example 1.

TABLE 12

($0 < x \leq 0.75, 0 < y < 1.0$)

| Sample No. | x | y | a/b | Blended amount (wt %) | Amount of glass Kind | (wt %) | Firing condition Temp. (° C.) | Time (hr) | Dielectric constant $\epsilon r$ | Dielectric loss tangent $\tan\delta \times 10^{-4}$ | Phases (note 1) |
|---|---|---|---|---|---|---|---|---|---|---|---|
| 4-38 | 0.01 | 0.9 | 1.9 | 98.0 | A | 2.0 | 950 | 1 | 5.0 | 8 | ZS>I>>G |
| 4-39 | 0.03 | 0.8 | 1.8 | 96.0 | A | 4.0 | 900 | 1 | 6.2 | 7 | ZS>I>>G |
| 4-40 | 0.04 | 0.7 | 1.7 | 96.0 | A | 4.0 | 900 | 3 | 9.1 | 6 | ZS>I>>G |

TABLE 12-continued ($0 < x \leq 0.75, 0 < y < 1.0$)

| Sample No. | x | y | a/b | Blended amount (wt %) | Amount of glass Kind | Amount of glass (wt %) | Firing condition Temp. (° C.) | Firing condition Time (hr) | Dielectric constant $\epsilon r$ | Dielectric loss tangent tan δ × $10^{-4}$ | Phases (note 1) |
|---|---|---|---|---|---|---|---|---|---|---|---|
| 4-41 | 0.06 | 0.6 | 1.6 | 94.0 | A | 6.0 | 925 | 1 | 11.0 | 8 | I>ZS>>G |
| 4-42 | 0.08 | 0.5 | 1.5 | 94.0 | A | 6.0 | 950 | 1 | 12.9 | 9 | I>ZS>>G |
| 4-43 | 0.11 | 0.4 | 1.4 | 92.0 | A | 8.0 | 950 | 1 | 16.0 | 7 | I>ZS>>G |
| 4-44 | 0.14 | 0.3 | 1.3 | 92.0 | A | 8.0 | 925 | 1 | 16.0 | 6 | I>ZS>>G |
| 4-45 | 0.17 | 0.2 | 1.2 | 90.0 | A | 10.0 | 900 | 2 | 17.0 | 8 | I>ZS>>G |
| 4-46 | 0.21 | 0.1 | 1.1 | 90.0 | A | 10.0 | 950 | 1 | 20.1 | 9 | I>ZS>>G |
| 4-47 | 0.02 | 0.9 | 1.0 | 97.0 | A | 3.0 | 950 | 1 | 6.6 | 7 | ZS>S>T>SP>G |
| 4-48 | 0.04 | 0.8 | 1.0 | 98.0 | A | 2.0 | 925 | 2 | 8.2 | 10 | ZS>S>T>>SP>G |
| 4-49 | 0.08 | 0.6 | 1.0 | 98.0 | A | 2.0 | 1000 | 1 | 12.3 | 10 | ZS>I>T>>SP>G |
| 4-50 | 0.10 | 0.5 | 1.0 | 98.0 | A | 2.0 | 1000 | 0.5 | 16.1 | 11 | ZS>I>T>>SP>G |
| 4-51 | 0.12 | 0.4 | 1.0 | 98.4 | A | 1.6 | 950 | 1 | 18.2 | 9 | ZS>I>T>>SP>G |
| 4-52 | 0.14 | 0.3 | 1.0 | 99.0 | A | 1.0 | 950 | 1 | 19.2 | 7 | I>ZS>T>>SP>G |
| 4-53 | 0.05 | 0.8 | 1.0 | 97.0 | A | 3.0 | 950 | 91 | 8.0 | 10 | ZS>I>T>>SP>G |
| 4-54 | 0.13 | 0.5 | 1.0 | 98.6 | A | 1.4 | 950 | 1 | 16.5 | 14 | ZS>I>T>>SP>G |
| 4-55 | 0.15 | 0.4 | 1.0 | 99.0 | A | 1.0 | 1000 | 1 | 17.6 | 7 | I>ZS>T>>SP>G |
| 4-56 | 0.53 | 0.3 | 1.0 | 98.4 | A | 1.6 | 975 | 1 | 18.5 | 11 | SP>T>ZS>>G |
| 4-57 | 0.45 | 0.4 | 1.0 | 98.6 | A | 1.4 | 975 | 2 | 16.7 | 9 | SP>T>ZS>>G |
| 4-58 | 0.15 | 0.8 | 1.0 | 98.2 | A | 1.8 | 1000 | 1 | 8.0 | 8 | ZS>SP>>G |
| 4-59 | 0.10 | 0.05 | 0.95 | 96.0 | A | 4.0 | 950 | 1 | 19.0 | 7 | SP>I>ZS>>G |
| 4-60 | 0.20 | 0.09 | 0.91 | 94.0 | A | 6.0 | 975 | 1 | 16.5 | 5 | I>ZS>>G |

Samples marked with * lie outside the scope of the invention.
Note 1)
ZS: willemite,
I: ilmenite,
S: $SiO_2$,
T: $TiO_2$,
SP: spinel
MS: $MgSiO_3$,
BT: $BaTiO_3$,
G: glass,
ZN: ZnO

TABLE 13

($0 < x \leq 0.75, 0 < y < 1.0$)

| Sample No. | x | y | a/b | Blended amount (wt %) | Amount of glass Kind | Amount of glass (wt %) | Firing condition Temp. (° C.) | Firing condition Time (hr) | Dielectric constant $\epsilon r$ | Dielectric loss tangent tan δ × $10^{-4}$ | Phases (note 1) |
|---|---|---|---|---|---|---|---|---|---|---|---|
| 4-61 | 0.30 | 0.13 | 0.8 | 92.0 | A | 8.0 | 975 | 1 | 14.1 | 6 | I>ZS>>G |
| *4-62 | 0.10 | 0.50 | 0.2 | 99.95 | A | 0.05 | 1300 | 10 | could not be measured | | SP>ZS>T>>G |
| 4-63 | 0.10 | 0.50 | 0.2 | 95.0 | A | 5.0 | 1000 | 1 | 41.3 | 10 | SP>ZS>T>>G |
| 4-64 | 0.10 | 0.50 | 0.2 | 90.0 | A | 10.0 | 950 | 1 | 30.2 | 15 | SP>ZS>T>G |
| 4-65 | 0.10 | 0.50 | 0.2 | 85.0 | A | 15.0 | 900 | 1 | 25.1 | 19 | SP>ZS>T>G |
| 4-66 | 0.10 | 0.50 | 0.2 | 70.0 | A | 30.0 | 900 | 0.5 | 19.2 | 19.5 | SP, ZS>G |
| *4-67 | 0.10 | 0.50 | 0.2 | 65.0 | A | 35.0 | 800 | 1 | could not be measured | | SP, ZS, G |
| *4-68 | 0.90 | 0.10 | 1.0 | 60.0 | A | 40.0 | 900 | 1 | 7.0 | 300 | MS>SP, ZS, G |
| *4-69 | 0.10 | 0.10 | 0.1 | 70.0 | A | 30.0 | 900 | 1 | could not be measured | | T>S, G>ZS, SP |
| 4-70 | 0.10 | 0.10 | 0.5 | 90.0 | A | 10.0 | 950 | 1 | 30.2 | 19 | T>G, ZS>SP, S |
| 4-71 | 0.10 | 0.10 | 3.5 | 97.0 | A | 3.0 | 950 | 1 | 21.0 | 12 | T>G, ZS>SP, S |
| *4-72 | 0.10 | 0.10 | 4.0 | 98.0 | A | 2.0 | 950 | 1 | could not be measured | | ZN>SP, ZS>>G |
| *4-73 | $BaTiO_3$ | | | 70.0 | A | 30.0 | 900 | 1 | could not be measured | | BT>G |
| *4-74 | mulite | | | 70.0 | A | 30.0 | 900 | 1 | could not be measured | | mulite>G |
| 4-75 | 0.06 | 0.6 | 1.6 | 93 | B | 7 | 925 | 1 | 10.0 | 8 | I>ZS>>G |
| 4-76 | 0.3 | 0.13 | 0.8 | 93 | B | 7 | 950 | 1 | 13.1 | 7 | I>ZS>>G |
| 4-77 | 0.45 | 0.4 | 1.0 | 97 | F | 3 | 975 | 1 | 15.5 | 11 | SP>T>ZS>>G |
| 4-78 | 0.05 | 0.8 | 1.0 | 96 | F | 4 | 950 | 2 | 8.4 | 12 | ZS>I>T>>SP, G |
| *4-79 | 0.3 | 0.13 | 0.8 | 75 | C | 25 | 1100 | 3 | could not be measured | | T>ZS, G>S |
| *4-80 | 0.3 | 0.13 | 0.8 | 50 | C | 50 | 975 | 1 | could not be measured | | T>G>ZS, S |

TABLE 13-continued

| | | | | | | | | | | |
|---|---|---|---|---|---|---|---|---|---|---|
| | | | | | ($0 < x \leq 0.75, 0 < y < 1.0$) | | | | | |
| | | | Blended | Amount of | | Firing condition | | Dielectric | Dielectric | |
| Sample | | | amount | | glass | Temp. | Time | constant | loss tangent | |
| No. | x | y | a/b | (wt %) | Kind | (wt %) | (° C.) | (hr) | $\epsilon r$ | $\tan \delta \times 10^{-4}$ Phases (note 1) |
| *4-81 | 0.45 | 0.4 | 1.0 | 95 | D | 5 | 1250 | 1 | could not be measured | SP>T>ZS>>G |
| *4-82 | 0.45 | 0.4 | 1.0 | 75 | D | 25 | 1000 | 1 | could not be measured | T>G>ZS, S, ZN |

Samples marked with * lie outside the scope of the invention.
Note 1)
ZS: willemite,
I: ilmenite,
S: $SiO_2$,
T: $TiO_2$,
SP: spinel
MS: $MgSiO_3$,
BT: $BaTiO_3$,
G: glass,
ZN: ZnO As will be obvious from the results of Tables 12 and 13, the ceramics of the invention in which the ilmenite-type crystal phase ((Zn, Mg)$TiO_3$), willemite-type crystal phase ((Zn, Mg)$_2SiO_4$) or spinel-type crystal phase ((Zn, Mg)$_2TiO_4$) has chiefly precipitated, exhibited excellent properties such as a dielectric constant of from 5 to 80 and a dielectric loss tangent of not larger than $20 \times 10^{-4}$ at 60 GHz, and could be sintered at 800 to 1000° C. As a result of analyzing the liquid phases of the ceramic products of the present invention by using an X-ray microanalyzer, Zn and B were detected from the grain boundary phases.

On the other hand, a sample No. 4-62 containing smaller than 0.1% by weight of a glass could not be obtained in a dense form unless the firing temperature was increased to 1300° C., and was not suited for the object of the present invention. On the other hand, a sample No. 70 containing not less than 30% by weight of the glass contained a liquid phase in a large amount, and the dielectric loss tangent was so large that the dielectric properties at 60 GHz could not be evaluated.

In a sample No. 4-72 (a/b>3.5) containing (Ti+Si) at a small ratio relative to (Zn+Mg), the ZnO phase precipitated to an excess degree. Therefore, the dielectric loss tangent was so great that the dielectric properties could not be evaluated at 60 GHz. In a sample No. 4-69 (a/b<0.14) containing (Ti+Si) at a large ratio relative to (Zn+Mg), the dielectric loss tangent of the ceramics was so large that the dielectric properties could not be measured.

In a sample No. 4-68 in which x>0.75, the amount of Zn was not enough, and the liquid phase was not formed with B in the glass. Therefore, the ceramics was not obtained in a dense form unless the glass was added in an amount of not smaller than 30% by weight, and poor dielectric properties were exhibited.

Example 12

Figure 18:
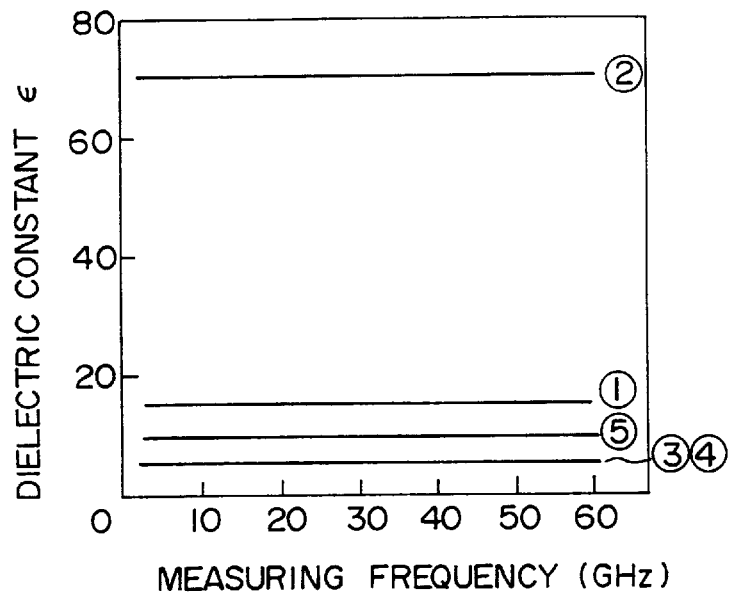
FIG. 18 is a diagram illustrating relationships between the dielectric constant and the frequency (Example 12) using the ceramics of the present invention and the ceramics of Comparative Examples.
Figure 19:
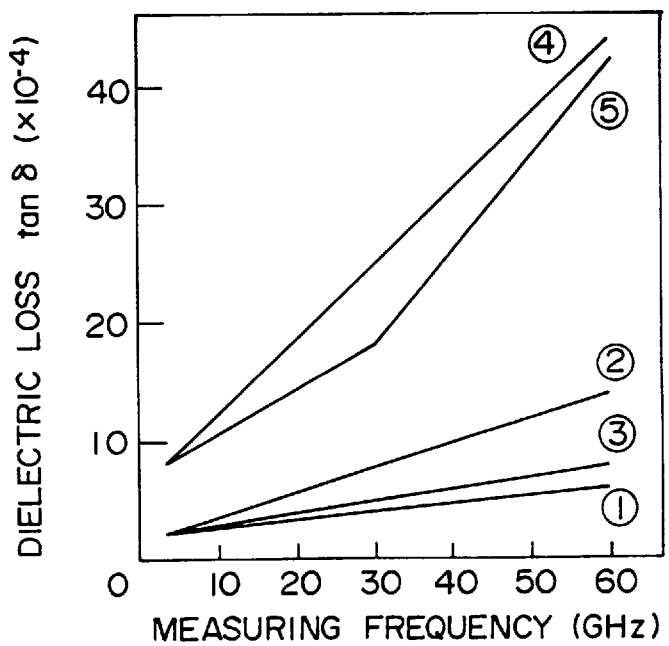
FIG. 19 is a diagram illustrating relationships between the dielectric loss tangent and the frequency (Example 12) using the ceramics of the present invention and the ceramics of Comparative Examples.

By using various ceramics, cylindrical samples (a) were prepared in a size of a diameter of 1 to 30 mm and a thickness of 2 to 15 mm, and were measured concerning their relationships between the dielectric constant and the frequency, and between the dielectric loss tangent and the frequency. The results were as shown in FIGS. 18 and 19. In FIGS. 18 and 19, ① and ② represent ceramics Nos. 4-6 and 4-13 of Example 10, ③ represents ceramics No. 4-38 of Example 11, ④ represents the cordierite-type glass ceramics (75% by weight of borosilicate glass and 25% by weight of $Al_2O_3$) as a Comparative Example, and ⑤ represents the alumina ceramics (95% by weight of $Al_2O_3$ and 5% by weight of CaO and MgO). The ceramics were measured for their dielectric constants and dielectric loss tangents by the dielectric cylindrical resonator method at high frequencies of 1 GHz, 10 GHz, 20 GHz, 30 GHz and 60 GHz and in the microwave and millimeter wave regions.

From the results of FIGS. 18 and 19, it will be understood that the cordierite-type glass ceramics which is a general-purpose product exhibits a dielectric constant of as low as 5, and the low-purity alumina for general use exhibits a dielectric constant of 9. On the other hand, the ceramic products of the present invention exhibited dielectric constants over a wide range of from 5, through 16 up to 70. The glass ceramics which is a general-purpose product exhibits a small dielectric loss tangent in a low-frequency region but exhibits deteriorated properties in a high-frequency region and exhibits a dielectric loss tangent of not smaller than $30 \times 10^{-4}$ at a frequency of not lower than 40 GHz. The alumina ceramics for general use, too, exhibited a dielectric loss of as large as $30 \times 10^{-4}$ at 50 GHz. On the other hand, the products ①, ② and ③ of the present invention exhibited dielectric loss tangent of as small as $15 \times 10^{-4}$ or less in a high-frequency region of 60 GHz.

Example 13

A $B_2O_3$ powder having an average particle size of not larger than 1 $\mu$m, and $Zn_2TiO_4$, $Zn_2SiO_4$, $TiO_2$ and $SiO_2$ powders having an average particle diameter of not larger than 1 $\mu$m, were mixed together in compliance with the compositions shown in Tables 14 and 15. To the mixtures were added an organic binder, a plasticizer and toluene, and green sheets of a thickness of 300 $\mu$m were prepared by the doctor blade method. Five green sheets were laminated one upon the other, and were adhered together at a temperature of 50° C. under a pressure of 100 kg/cm². The binder was removed from the thus obtained laminates of some of the compositions in a water vapor-containing nitrogen atmosphere at 500 to 700° C. The laminates were then fired in the open air under the conditions of Tables 14 and 15 to obtain ceramics for multi-layer substrates.

The obtained ceramics were measured for their dielectric constants and dielectric loss tangents in the same manner as in Example 1, and the phases formed in the ceramics were identified by the X-ray diffraction. The results were as shown in Tables 14 and 15.

TABLE 14

(x = 0, 0 < y < 1.0)

| Sample No. | y | a/b | Blended amount (wt. %) | Amount of $B_2O_3$ (wt %) | Firing condition Temp. (° C.) | Time (hr) | Dielectric constant $\epsilon r$ | Dielectric loss tangent $\tan\delta \times 10^{-4}$ | Phases (note 1) |
|---|---|---|---|---|---|---|---|---|---|
| 5-1 | 0.1 | 1.0 | 99.5 | 0.5 | 900 | 1 | 21.0 | 10 | SP>ZS>T>>G |
| 5-2 | 0.9 | 1.9 | 99.0 | 1.0 | 950 | 1 | 5.7 | 9 | ZS>SP>>G |
| 5-3 | 0.8 | 1.8 | 98.0 | 2.0 | 900 | 1 | 6.6 | 8 | ZS>SP>>G |
| 5-4 | 0.7 | 1.7 | 98.0 | 2.0 | 900 | 3 | 10.0 | 7 | ZS>SP>>G |
| 5-5 | 0.6 | 1.6 | 97.0 | 3.0 | 925 | 1 | 11.5 | 9 | SP>ZS>>G |
| 5-6 | 0.5 | 1.5 | 97.0 | 3.0 | 950 | 1 | 14.0 | 10 | SP>ZS>>G |
| 5-7 | 0.4 | 1.4 | 96.0 | 4.0 | 950 | 1 | 17.0 | 9 | SP>ZS>>G |
| 5-8 | 0.3 | 1.3 | 96.0 | 4.0 | 925 | 1 | 16.6 | 7 | SP>ZS>>G |
| 5-9 | 0.2 | 1.2 | 95.0 | 5.0 | 900 | 2 | 17.5 | 11 | SP>ZS>>G |
| 5-10 | 0.1 | 1.1 | 95.0 | 5.0 | 950 | 1 | 21.0 | 12 | SP>ZS>>G |
| *5-11 | 0.1 | 4.0 | 99.0 | 1.0 | 925 | 1 | could not be measured | | ZN>SP>ZS>>G |
| *5-12 | 0.1 | 3.5 | 98.5 | 1.5 | 975 | 2 | 17.5 | 22 | SP>ZS>ZN>>G |
| 5-13 | 0.1 | 2.5 | 98.5 | 1.5 | 950 | 1 | 16.5 | 19 | SP>ZS>ZN>>G |
| 5-14 | 0.1 | 0.2 | 96.0 | 4.0 | 975 | 1 | 7.5 | 20 | SP>T>ZS>>G |
| *5-15 | 0.1 | 0.1 | 75.0 | 25.0 | 900 | 1 | could not be measured | | T>S, G |
| 5-16 | 0.9 | 1.0 | 98.5 | 1.5 | 950 | 1 | 7.0 | 9 | ZS>S>T>SP>G |
| 5-17 | 0.8 | 1.0 | 99.0 | 1.0 | 925 | 2 | 8.5 | 12 | ZS>S>T>>SP>G |
| 5-18 | 0.8 | 1.0 | 98.5 | 1.5 | 950 | 1 | 8.3 | 11 | ZS>SP>T>>I>G |

Samples marked with * lie outside the scope of the invention.
Note 1)
ZS: willemite,
I: ilmenite,
S: $SiO_2$,
T: $TiO_2$,
SP: spinel
MS: $MgSiO_3$,
BT: $BaTiO_3$,
G: glass,
ZN: ZnO

TABLE 15

(x = 0, 0 < y < 1.0)

| Sample No. | y | a/b | Blended amount (wt. %) | Amount of $B_2O_3$ (wt %) | Firing condition Temp. (° C.) | Time (hr) | Dielectric constant $\epsilon r$ | Dielectric loss tangent $\tan\delta \times 10^{-4}$ | Phases (note 1) |
|---|---|---|---|---|---|---|---|---|---|
| 5-19 | 0.6 | 1.0 | 99.0 | 1.0 | 1000 | 1 | 13.0 | 13 | ZS>SP>T>>I>G |
| 5-20 | 0.5 | 1.0 | 99.0 | 1.0 | 1000 | 0.5 | 17.0 | 15 | ZS>SP>T>>I>G |
| 5-21 | 0.4 | 1.0 | 99.2 | 0.8 | 950 | 1 | 18.6 | 11 | ZS>SP>T>>I>G |
| 5-22 | 0.5 | 1.0 | 99.3 | 0.7 | 950 | 1 | 17.5 | 22 | ZS>SP>T>>I>G |
| 5-23 | 0.3 | 1.0 | 99.5 | 0.5 | 950 | 1 | 20.0 | 9 | SP>ZS>T>>I>G |
| 5-24 | 0.4 | 1.0 | 99.5 | 0.5 | 1000 | 1 | 18.0 | 8 | SP>ZS>T>>I>G |
| 5-25 | 0.8 | 1.0 | 99.1 | 0.9 | 1000 | 1 | 8.5 | 11 | ZS>SP>>G |
| 5-26 | 0.4 | 1.0 | 99.3 | 0.7 | 975 | 2 | 17.2 | 15 | SP>T>ZS>>G |
| 5-27 | 0.2 | 1.0 | 99.2 | 0.8 | 975 | 1 | 19.0 | 17 | SP>T>ZS>>G |
| *5-28 | 0.50 | 1.0 | 70.0 | 30.0 | 900 | 1 | 7.7 | 300 | MS>SP, ZS, G |
| 5-29 | 0.05 | 0.95 | 98.0 | 2.0 | 950 | 1 | 20.0 | 10 | SP>I>ZS>>G |
| 5-30 | 0.09 | 0.91 | 97.0 | 3.0 | 975 | 1 | 17.0 | 8 | SP>ZS>>G |
| 5-31 | 0.13 | 0.8 | 96.0 | 4.0 | 975 | 1 | 14.5 | 9 | SP>ZS>>G |
| *5-32 | 0.50 | 0.2 | 99.99 | 0.01 | 1300 | 10 | could not be measured | | SP>ZS>T>>G |
| 5-33 | 0.50 | 0.2 | 93.0 | 7.0 | 1000 | 1 | 40.7 | 15 | SP>ZS>T>>G |
| 5-34 | 0.50 | 0.2 | 90.0 | 10.0 | 950 | 1 | 32.5 | 21 | SP>ZS>T>C |
| 5-35 | 0.50 | 0.2 | 85.0 | 15.0 | 900 | 1 | 27.0 | 27 | SP>ZS>T>C |
| *5-36 | 0.50 | 0.2 | 75.0 | 25.0 | 800 | 1 | could not be measured | | SP, ZS, G |

Samples marked with * lie outside the scope of the invention.
Note 1)
ZS: willemite,
I: ilmenite,
S: $SiO_2$,
T: $TiO_2$,
SP: spinel
MS: $MgSiO_3$,
BT: $BaTiO_3$,
G: glass,
ZN: ZnO As will be obvious from the results of Tables 14 and 15, the ceramics of the invention in which the willemite-type crystal phase ($Zn_2SiO_4$) or the spinel-type crystal phase ($Zn_2TiO_4$) has chiefly precipitated, permitted the dielectric constant to be adjusted over a range of from 5 to 80, and exhibited excellent properties such as a dielectric loss tangent of not larger than $30 \times 10^{-4}$ at 60 GHz, and could be sintered at 800 to 1000° C. As a result of analyzing the crystalline grain boundary phases of the ceramic products of the invention by using an X-ray microanalyzer, Zn and B were detected from the grain boundary phases.

On the other hand, a sample No. 5-32 containing $B_2O_3$ in an amount of smaller than 0.05% by weight could not be obtained in a dense form unless the firing temperature was increased to 1300° C., and was not suited for the object of the present invention. On the other hand, samples Nos. 5-15, 5-28 and 5-36 containing $B_2O_3$ in an amount in excess of 20% by weight contained the liquid phase in such large amounts that the dielectric losses were great, and the dielectric properties at 60 GHz could not be evaluated.

In a sample No. 5-11 (a/b>3.5) containing (Ti+Si) at a small ratio relative to Zn, the ZnO phase precipitated to an excess degree. Therefore, the dielectric loss tangent was so great that the dielectric properties could not be evaluated at 60 GHz. A sample No. 5-15 (a/b<0.14) containing (Ti+Si) at a large ratio relative to Zn could not be obtained in a dense form unless $B_2O_3$ was added in an amount of not smaller than 20% by weight. When $B_2O_3$ was added in an amount of not smaller than 20% by weight, however, the liquid phase increased so excessively that the ceramics exhibited an increased dielectric loss.

Example 14

The glass powder (see Table 2) used in Example 2 and a $Zn_2TiO_4$ powder having an average diameter of not larger than 1 μm were mixed together in compliance with the compositions shown in Tables 16 and 17. Green sheets were prepared by using these mixtures in the same manner as in Example 13. Five green sheets were laminated one upon the other and were adhered together at a temperature of 50° C. under a pressure of 100 kg/cm². The binder was removed from the thus obtained laminates of some of the compositions in a water vapor-containing nitrogen atmosphere at 500 to 700° C. The laminates were then fired in dry nitrogen under the conditions of Tables 16 and 17 to obtain ceramics for multi-layer substrates. From the laminates of other compositions was also removed the binder in the open air at 500 to 700° C. The laminates were then fired in the open air under the conditions of Tables 16 and 17 to obtain ceramics for a multi-layer substrate. The obtained sintered products were measured for their dielectric constants and dielectric losses in the same manner as in Example 1 based on the X-ray diffraction. The results were as shown in Tables 16 and 17.

TABLE 16

(x = 0, 0 < y < 1.0)

| Sample No. | y | a/b | Blended amount (wt %) | Amount of glass Kind | (wt %) | Firing condition Temp. (° C.) | Time (hr) | Dielectric constant $\epsilon r$ | Dielectric loss tangent tan$\delta \times 10^{-4}$ | Phases (note 1) |
|---|---|---|---|---|---|---|---|---|---|---|
| 5-37 | 0.1 | 1.0 | 99.0 | A | 1.0 | 900 | 1 | 23.5 | 20 | SP>ZS>T>>G |
| 5-38 | 0.9 | 1.9 | 98.0 | A | 2.0 | 950 | 1 | 5.5 | 15 | ZS>SP>>G |
| 5-39 | 0.8 | 1.8 | 96.0 | A | 4.0 | 900 | 1 | 6.7 | 14 | ZS>SP>>G |
| 5-40 | 0.7 | 1.7 | 96.0 | A | 4.0 | 900 | 3 | 9.7 | 13 | ZS>SP>>G |
| 5-41 | 0.6 | 1.6 | 94.0 | A | 6.0 | 925 | 1 | 12.0 | 14 | SP>ZS>>G |
| 5-42 | 0.5 | 1.5 | 94.0 | A | 6.0 | 950 | 1 | 13.5 | 15 | SP>ZS>>G |
| 5-43 | 0.4 | 1.4 | 92.0 | A | 8.0 | 950 | 1 | 16.5 | 10 | SP>ZS>>G |
| 5-44 | 0.3 | 1.3 | 92.0 | A | 8.0 | 925 | 1 | 16.0 | 9 | SP>ZS>>G |
| 5-45 | 0.2 | 1.2 | 90.0 | A | 10.0 | 900 | 2 | 17.7 | 11 | SP>ZS>>G |
| 5-46 | 0.1 | 1.1 | 90.0 | A | 10.0 | 950 | 1 | 21.0 | 13 | SP>ZS>>G |
| 5-47 | 0.9 | 1.0 | 97.0 | A | 3.0 | 950 | 1 | 7.2 | 11 | ZS>S>T>SP>G |
| 5-48 | 0.8 | 1.0 | 98.0 | A | 2.0 | 925 | 2 | 8.7 | 16 | ZS>S>T>>SP>G |
| 5-49 | 0.6 | 1.0 | 98.0 | A | 2.0 | 1000 | 1 | 12.6 | 16 | ZS>SP>T>>I>G |
| 5-50 | 0.5 | 1.0 | 98.0 | A | 2.0 | 1000 | 0.5 | 16.6 | 17 | ZS>SP>T>>I>G |
| 5-51 | 0.4 | 1.0 | 98.4 | A | 1.6 | 950 | 1 | 18.5 | 13 | ZS>SP>T>>I>G |
| 5-52 | 0.3 | 1.0 | 99.0 | A | 1.0 | 950 | 1 | 19.9 | 10 | SP>ZS>T>>I>G |
| 5-53 | 0.8 | 1.0 | 97.0 | A | 3.0 | 950 | 1 | 9.0 | 15 | ZS>SP>T>>I>G |
| 5-54 | 0.5 | 1.0 | 98.6 | A | 1.4 | 950 | 1 | 17.0 | 22 | ZS>SP>T>>I>G |
| 5-55 | 0.4 | 1.0 | 99.0 | A | 1.0 | 1000 | 1 | 18.0 | 9 | SP>ZS>T>>I>G |
| 5-56 | 0.3 | 1.0 | 98.4 | A | 1.6 | 975 | 1 | 19.2 | 14 | SP>T>ZS>>G |
| 5-57 | 0.4 | 1.0 | 98.6 | A | 1.4 | 975 | 2 | 17.5 | 12 | SP>T>ZS>>G |
| 5-58 | 0.8 | 1.0 | 98.2 | A | 1.8 | 1000 | 1 | 8.7 | 11 | ZS>SP>>G |

Samples marked with * lie outside the scope of the invention.
Note 1)
ZS: willemite,
I: ilmenite,
S: $SiO_2$,
T: $TiO_2$,
SP: spinel
MS: $MgSiO_3$,
BT: $BaTiO_3$,
G: glass,
ZN: ZnO

TABLE 17

(x = 0, 0 < y < 1.0)

| Sample No. | y | a/b | Blended amount (wt %) | Amount of glass Kind | Amount of glass (wt %) | Firing condition Temp. (° C.) | Firing condition Time (hr) | Dielectric constant $\epsilon r$ | Dielectric loss tangent $\tan\delta \times 10^{-4}$ | Phases (note 1) |
|---|---|---|---|---|---|---|---|---|---|---|
| 5-59 | 0.05 | 0.95 | 96.0 | A | 4.0 | 950 | 1 | 19.3 | 10 | SP>I>ZS>>G |
| 5-60 | 0.09 | 0.91 | 94.0 | A | 6.0 | 975 | 1 | 17.0 | 7 | SP>ZS>>G |
| 5-61 | 0.13 | 0.8 | 92.0 | A | 8.0 | 975 | 1 | 14.5 | 8 | SP>ZS>>G |
| *5-62 | 0.50 | 0.2 | 99.95 | A | 0.05 | 1300 | 10 | could not be measured | | SP>ZS>T>>G |
| 5-63 | 0.50 | 0.2 | 95.0 | A | 5.0 | 1000 | 1 | 42.0 | 15 | SP>ZS>T>>G |
| 5-64 | 0.50 | 0.2 | 90.0 | A | 10.0 | 950 | 1 | 31.5 | 23 | SP>ZS>T>G |
| 5-65 | 0.50 | 0.2 | 85.0 | A | 15.0 | 900 | 1 | 26.7 | 25 | SP>ZS>T>G |
| 5-66 | 0.50 | 0.2 | 70.0 | A | 30.0 | 900 | 0.5 | 20.3 | 29 | SP, ZS>G |
| *5-67 | 0.50 | 0.2 | 65.0 | A | 35.0 | 800 | 1 | could not be measured | | SP, ZS, G |
| *5-68 | 0.10 | 1.0 | 60.0 | A | 40.0 | 900 | 1 | 7.7 | 300 | MS>SP, ZS, G |
| *5-69 | 0.10 | 0.1 | 70.0 | A | 30.0 | 900 | 1 | could not be measured | | T>S, G>ZS, SP |
| 5-70 | 0.10 | 0.5 | 90.0 | A | 10.0 | 950 | 1 | 30.5 | 21 | T>G, ZS>SP, S |
| 5-71 | 0.10 | 3.5 | 97.0 | A | 3.0 | 950 | 1 | 22.0 | 15 | T>G, ZS>SP, S |
| 5-72 | 0.10 | 4.0 | 98.0 | A | 2.0 | 900 | 1 | could not be measured | | ZN>SP, ZS>>G |
| 5-73 | 0.6 | 1.6 | 93 | B | 7 | 925 | 1 | 10.7 | 10 | SP>ZS>>G |
| 5-74 | 0.13 | 0.8 | 93 | B | 7 | 950 | 1 | 14.2 | 9 | SP>ZS>>G |
| 5-75 | 0.4 | 1.0 | 97 | F | 3 | 975 | 1 | 16.2 | 13 | SP>T>ZS>>G |
| 5-76 | 0.8 | 1 | 96 | F | 4 | 950 | 2 | 8.9 | 14 | ZS>SP>T>>I, G |
| *5-77 | 0.13 | 0.8 | 75 | C | 25 | 1100 | 3 | could not be measured | | T>ZS, G>S |
| *5-78 | 0.13 | 0.8 | 50 | C | 50 | 975 | 1 | could not be measured | | T>G>ZS, S |
| *5-79 | 0.4 | 1.0 | 95 | D | 5 | 1250 | 1 | could not be measured | | SP>T>ZS>>G |
| *5-80 | 0.4 | 1.0 | 75 | D | 25 | 1000 | 1 | could not be measured | | T>G>ZS, S, ZN |

Samples marked with * lie outside the scope of the invention.
Note 1)
ZS: willemite,
I: ilmenite,
S: $SiO_2$,
T: $TiO_2$,
SP: spinel
MS: $MgSiO_3$,
BT: $BaTiO_3$,
G: glass,
ZN: ZnO As will be obvious from the results of Tables 16 and 17, the ceramics of the invention in which the willemite-type crystal phase ($Zn_2SiO_4$) or the spinel-type crystal phase ($Zn_2TiO_4$) has chiefly precipitated, exhibited excellent properties such as a dielectric constant of from 5 to 80 and a dielectric loss of not larger than $30\times10^{-4}$ at 60 GHz, and could be sintered at 800 to 1000° C. As a result of analyzing the grain boundary phases of the ceramic products of the present invention by using an X-ray microanalyzer, Zn and B were detected from the grain boundary phases.

On the other hand, a sample No. 5-62 containing smaller than 0.1% by weight of a glass could not be obtained in a dense form unless the firing temperature was increased to 1300° C., and was not suited for the object of the present invention. On the other hand, a sample No. 5-67 containing larger than 30% by weight of the glass contained a liquid phase in a large amount, and the dielectric loss tangent was so large that the dielectric properties at 60 GHz could not be evaluated.

In a sample No. 5-72 (a/b>3.5) containing (Ti+Si) at a small ratio relative to Zn, the ZnO phase precipitated to an excess degree. Therefore, the dielectric loss tangent was so great that the dielectric properties could not be evaluated at 60 GHz. In a sample No. 5-69 (a/b<0.14) containing (Ti+Si) at a large ratio relative to Zn, the dielectric loss tangent of the ceramics was so large that the dielectric properties could not be measured.

Example 15

By using various ceramics, cylindrical samples (a) were prepared in a size of a diameter of 1 to 30 mm and a thickness of 2 to 15 mm. The ceramics Nos. 5-7 and 5-14 of Example 13, the ceramics No. 5-38 of Example 14, and, as Comparative Examples, a cordierite-type glass ceramics (75% by weight of borosilicate glass and 25% by weight of $Al_2O_3$) which is a general-purpose product and alumina ceramics (95% by weight of $Al_2O_3$ and 5% by weight of CaO, MgO) for general use, were measured for their dielectric loss tangents by the dielectric cylindrical resonator method at high frequencies of 1 GHz, 10 GHz, 20 GHz, 30 GHz and 60 GHz and in the microwave and millimeter wave regions.

As a result, the glass ceramics which is a general-purpose product exhibited a small dielectric loss tangent in the low-frequency region but exhibited deteriorated properties at the high-frequency region and exhibited a dielectric loss tangent of not smaller than $30\times10^{-4}$ at a frequency of not lower than 40 GHz. The alumina ceramics, too, exhibited a dielectric loss tangent of as large as $30\times10^{-4}$ at 50 GHz. On the other hand, the products of the present invention exhibited a dielectric loss tangent of as small as $20\times10^{-4}$ in the high-frequency region of 60 GHz.

We claim:
1. Dielectric ceramics comprising 85 to 99.95% by weight of a Zn-containing composite oxide of which the composition of constituent metals is represented by the following formula (1) as expressed by atomic ratios:

$$a(Zn_{1-x} \cdot Mg_x) \cdot b(Ti_{1-y} \cdot Si_y) \tag{1}$$

wherein x, y, a and b are numbers satisfying the following conditions, $0 \leq x \leq 0.75$ $0 \leq y \leq 1$ $0.14 \leq a/b \leq 3.5$ where $a/b \neq 1$ when $x=y=0$, and 0.05 to 15% by weight of $B_2O_3$, and exhibiting a dielectric loss tangent at 30 to 60 GHz of not larger than $30 \times 10^{-4}$.

2. Dielectric ceramics according to claim 1, wherein said Zn-containing composite oxide has a composition of the formula (1) in which x and y satisfy the following conditions, $0 < x \leq 0.75$ $y = 0$ and said dielectric ceramics contains an ilmenite crystal phase or a spinel crystal phase, and exhibits a dielectric constant of not smaller than 15 and a dielectric loss tangent of not larger than $15 \times 10^{-4}$ in a region of from 30 to 60 GHz.

3. Dielectric ceramics according to claim 2, further containing a rutile $TiO_2$ crystal phase.

4. Dielectric ceramics according to claim 1, wherein said Zn-containing composite oxide has a composition of the formula (1) in which x and y satisfy the following condition, $x = y = 0$ and said dielectric ceramics contains at least two kinds of crystal phases selected from the group consisting of a spinel crystal phase, an ilmenite crystal phase, a rutile $TiO_2$ crystal phase and a ZnO crystal phase, and has a dielectric constant of not smaller than 15 and a dielectric loss tangent of not larger than $15 \times 10^{-4}$ in a region of from 30 to 60 GHz.

5. Dielectric ceramics according to claim 1, wherein said Zn-containing composite oxide has a composition of the formula (1) in which x and y satisfy the following conditions, $x = 0$ $y = 1$ and said dielectric ceramics contains a willemite crystal phase or an $SiO_2$ crystal phase, and exhibits a dielectric constant of not larger than 6 and a dielectric loss tangent of not larger than $15 \times 10^{-4}$ in a region of from 30 to 60 GHz.

6. Dielectric ceramics according to claim 1, wherein said Zn-containing composite oxide has a composition of the formula (1) in which x and y satisfy the following conditions, $0 < x \leq 0.75$ $0 < y < 1.0$ and said dielectric ceramics contains at least one kind of crystal phase selected from the group consisting of a willemite crystal phase, an ilmenite crystal phase, a spinel crystal phase, a rutile $TiO_2$ crystal phase and an $SiO_2$ crystal phase, and exhibits a dielectric constant of from 5 to 80 and a dielectric loss tangent of not larger than $20 \times 10^{-4}$ in a region of from 30 to 60 GHz.

7. Dielectric ceramics according to claim 1, wherein said Zn-containing composite oxide has a composition of the formula (1) in which x and y satisfy the following conditions, $x = 0$ $0 < y < 1.0$ and said dielectric ceramics contains at least one kind of crystal phase selected from the group consisting of a willemite crystal phase, an ilmenite crystal phase, a spinel crystal phase, a rutile $TiO_2$ crystal phase and an $SiO_2$ crystal phase, and exhibits a dielectric constant of from 5 to 80 and a dielectric loss tangent of not larger than $30 \times 10^{-4}$ in a region of from 30 to 60 GHz.

8. Dielectric ceramics comprising 70 to 99.9% by weight of a Zn-containing composite oxide of which the composition of constituent metals is represented by the following formula (1) as expressed by atomic ratios:

$$a(Zn_{1-x} \cdot Mg_x) \cdot b(Ti_{1-y} \cdot Si_y) \qquad (1)$$

wherein x, y, a and b are numbers satisfying the following conditions, $0 \leq x \leq 0.75$ $0 \leq y \leq 1$ $0.14 \leq a/b \leq 3.5$ where $a/b \neq 1$ when $x=y=0$, and 0.1 to 30% by weight of a glass containing at least $SiO_2$ and $B_2O_3$, and exhibiting a dielectric loss tangent at 30 to 60 GHz of not larger than $30 \times 10^{-4}$.

9. Dielectric ceramics according to claim 8, wherein said Zn-containing composite oxide has a composition of the formula (1) in which x and y satisfy the following conditions, $0 < x \leq 0.75$ $y = 0$ and said dielectric ceramics contains an ilmenite crystal phase or a spinel crystal phase, and exhibits a dielectric constant of not smaller than 15 and a dielectric loss tangent of not larger than $15 \times 10^{-4}$ in a region of from 30 to 60 GHz.

10. Dielectric ceramics according to claim 9, further containing a rutile $TiO_2$ crystal phase.

11. Dielectric ceramics according to claim 8, wherein said Zn-containing composite oxide has a composition of the formula (1) in which x and y satisfy the following condition, $x = y = 0$ and said dielectric ceramics contains at least two kinds of crystal phases selected from the group consisting of a spinel crystal phase, an ilmenite crystal phase, a rutile $TiO_2$ crystal phase and a ZnO crystal phase, and has a dielectric constant of not smaller than 15 and a dielectric loss tangent of not larger than $15 \times 10^{-4}$ in a region of from 30 to 60 GHz.

12. Dielectric ceramics according to claim 8, wherein said Zn-containing composite oxide has a composition of the formula (1) in which x and y satisfy the following conditions, $x = 0$ $y = 1$ and said dielectric ceramics contains a willemite crystal phase or an $SiO_2$ crystal phase, and exhibits a dielectric constant of not larger than 6 and a dielectric loss tangent of not larger than $15 \times 10^{-4}$ in a region of from 30 to 60 GHz.

13. Dielectric ceramics according to claim 8, wherein said Zn-containing composite oxide has a composition of the formula (1) in which x and y satisfy the following conditions, $0 < x \leq 0.75$ $0 < y < 1.0$ and said dielectric ceramics contains at least one kind of crystal phase selected from the group consisting of a willemite crystal phase, an ilmenite crystal phase, a spinel crystal phase, a rutile $TiO_2$ crystal phase and an $SiO_2$ crystal phase, and exhibits a dielectric constant of from 5 to 80 and a dielectric loss tangent of not larger than $20 \times 10^{-4}$ in a region of from 30 to 60 GHz.

14. Dielectric ceramics according to claim 8, wherein said Zn-containing composite oxide has a composition of the formula (1) in which x and y satisfy the following conditions, x=0

0<y<1.0 and said dielectric ceramics contains at least one kind of crystal phase selected from the group consisting of a willemite crystal phase, an ilmenite crystal phase, a spinel crystal phase, a rutile $TiO_2$ crystal phase and an $SiO_2$ crystal phase, and exhibits a dielectric constant of from 5 to 80 and a dielectric loss tangent of not larger than $30 \times 10^{-4}$ in a region of from 30 to 60 GHz.

* * * * *